(12) United States Patent
Nakagawa et al.

(10) Patent No.: US 11,049,806 B2
(45) Date of Patent: Jun. 29, 2021

(54) SEMICONDUCTOR DEVICE INCLUDING SEMICONDUCTOR CHIP TRANSMITTING SIGNALS AT HIGH SPEED

(71) Applicant: RENESAS ELECTRONICS CORPORATION, Tokyo (JP)

(72) Inventors: Kazuyuki Nakagawa, Tokyo (JP); Shinji Baba, Tokyo (JP); Hiroshi Koizumi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 201 days.

(21) Appl. No.: 16/370,370

(22) Filed: Mar. 29, 2019

(65) Prior Publication Data

US 2019/0318990 A1    Oct. 17, 2019

(30) Foreign Application Priority Data

Apr. 16, 2018  (JP) .............................. JP2018-078590

(51) Int. Cl.
*H01L 23/522* (2006.01)
*H01L 23/528* (2006.01)
(Continued)

(52) U.S. Cl.
CPC .......... *H01L 23/5226* (2013.01); *H01L 23/34* (2013.01); *H01L 23/48* (2013.01);
(Continued)

(58) Field of Classification Search
CPC ............. H01L 23/48; H01L 23/481482; H01L 23/4828; H01L 23/498; H01L 23/49811; H01L 23/49816; H01L 23/49822; H01L 23/49827; H01L 23/49838; H01L 23/52; H01L 23/522; H01L 23/5226;
(Continued)

(56) References Cited

U.S. PATENT DOCUMENTS 9,793,199 B2    10/2017 Leung et al.
2008/0128911 A1   6/2008 Koyama
(Continued)

FOREIGN PATENT DOCUMENTS

JP    2008-124398 A    5/2008
JP    2013-514668 A    4/2013

*Primary Examiner* — Eduardo A Rodela
*Assistant Examiner* — Christopher M Roland
(74) *Attorney, Agent, or Firm* — McDermott Will & Emery LLP

(57) ABSTRACT

A semiconductor device includes a wiring substrate provided with a plurality of pads electrically connected to a semiconductor chip in a flip-chip interconnection. The wiring substrate includes a pad forming layer in which a signal pad configured to receive transmission of a first signal and a second pad configured to receive transmission of a second signal different from the first signal are formed and a first wiring layer located at a position closest to the pad forming layer. In the wiring layer, a via land overlapping with the signal pad, a wiring connected to the via land, and a wiring connected to the second pad and extending in an X direction are formed. In a Y direction intersecting the X direction, a width of the via land is larger than a width of the wiring. A wiring is adjacent to the via land and overlaps with the signal pad.

15 Claims, 26 Drawing Sheets

(51) Int. Cl.
    *H01L 23/48*    (2006.01)
    *H01L 23/482*   (2006.01)
    *H01L 23/498*   (2006.01)
    *H01L 23/52*    (2006.01)
    *H01L 23/538*   (2006.01)
    *H01L 23/532*   (2006.01)
    *H01L 23/34*    (2006.01)
    *H01L 23/00*    (2006.01)

(52) U.S. Cl.
    CPC .......... *H01L 23/481* (2013.01); *H01L 23/482* (2013.01); *H01L 23/5283* (2013.01); *H01L 23/53228* (2013.01); *H01L 24/09* (2013.01); *H01L 24/17* (2013.01); *H01L 24/32* (2013.01); *H01L 24/73* (2013.01); *H01L 23/4828* (2013.01); *H01L 23/498* (2013.01); *H01L 23/49811* (2013.01); *H01L 23/49816* (2013.01); *H01L 23/49822* (2013.01); *H01L 23/49827* (2013.01); *H01L 23/49838* (2013.01); *H01L 23/52* (2013.01); *H01L 23/522* (2013.01); *H01L 23/528* (2013.01); *H01L 23/5386* (2013.01); *H01L 24/02* (2013.01); *H01L 24/04* (2013.01); *H01L 24/05* (2013.01); *H01L 24/07* (2013.01); *H01L 24/08* (2013.01); *H01L 24/12* (2013.01); *H01L 24/13* (2013.01); *H01L 24/15* (2013.01); *H01L 24/16* (2013.01); *H01L 24/20* (2013.01); *H01L 24/24* (2013.01); *H01L 24/28* (2013.01); *H01L 24/29* (2013.01); *H01L 24/31* (2013.01); *H01L 24/63* (2013.01); *H01L 24/65* (2013.01); *H01L 24/68* (2013.01); *H01L 2224/0401* (2013.01); *H01L 2224/0508* (2013.01); *H01L 2224/13006* (2013.01)

(58) Field of Classification Search
    CPC ............... H01L 23/528; H01L 23/5283; H01L 23/5386; H01L 24/02; H01L 24/04; H01L 24/05; H01L 24/07; H01L 24/08; H01L 24/09; H01L 24/12; H01L 24/13; H01L 24/15; H01L 24/16; H01L 24/17; H01L 24/20; H01L 24/24; H01L 24/28; H01L 24/29; H01L 24/31; H01L 24/32; H01L 24/63; H01L 24/65; H01L 24/68; H01L 2224/0508; H01L 2224/05082; H01L 2224/05083; H01L 2224/05084; H01L 2224/05085; H01L 2224/13006; H01L 2224/13082; H01L 2224/16013; H01L 2224/16225; H01L 2224/16238; H01L 2224/32225; H01L 2224/73204; H01L 2224/73253; H01L 2924/00
    See application file for complete search history.

(56) References Cited

U.S. PATENT DOCUMENTS

| | | | |
|---|---|---|---|
| 2011/0248399 A1* | 10/2011 | Pendse | H01L 24/97 257/737 |
| 2014/0191390 A1* | 7/2014 | Chuang | H01L 24/05 257/737 |
| 2017/0033038 A1* | 2/2017 | Nakagawa | H01L 23/49816 |
| 2017/0062322 A1* | 3/2017 | Sakata | H01L 24/49 |
| 2018/0047571 A1* | 2/2018 | Hunt | H01L 21/6835 |
| 2018/0098420 A1* | 4/2018 | Kariyazaki | H01L 23/32 |
| 2018/0158771 A1* | 6/2018 | Akiba | H01L 24/97 |

* cited by examiner

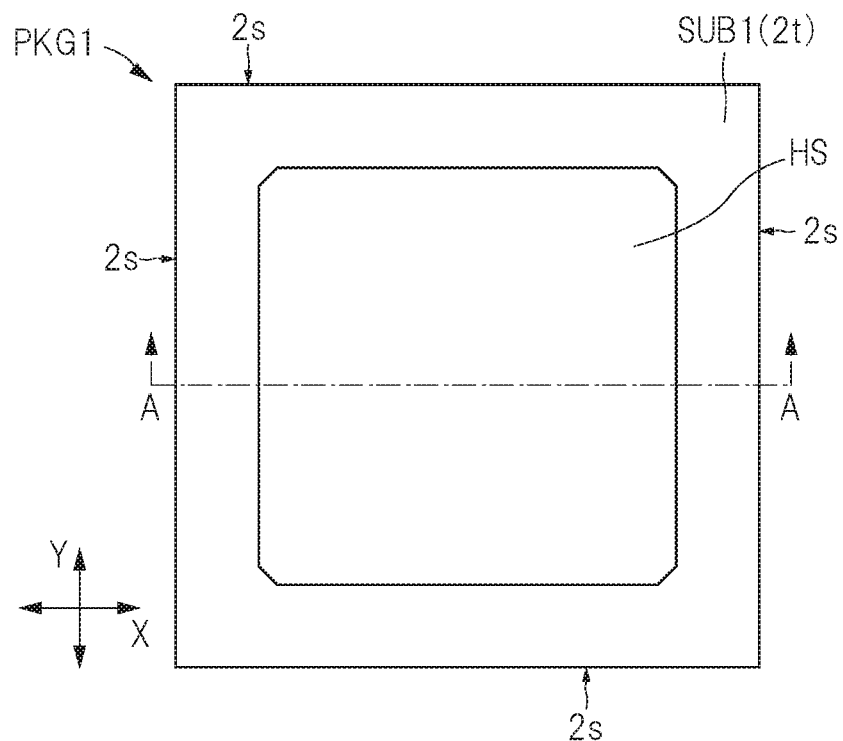
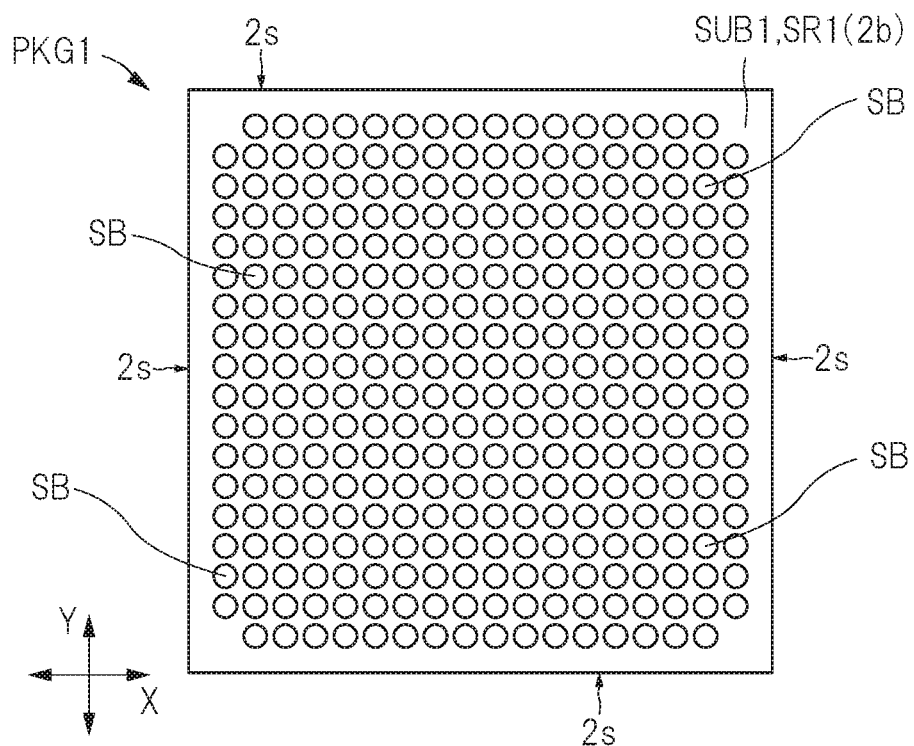

SEMICONDUCTOR DEVICE INCLUDING SEMICONDUCTOR CHIP TRANSMITTING SIGNALS AT HIGH SPEED

CROSS-REFERENCE TO RELATED APPLICATION

The present application claims priority from Japanese Patent Application No. 2018-078590 filed on Apr. 16, 2018, the content of which is hereby incorporated by reference into this application.

TECHNICAL FIELD OF THE INVENTION

The present invention relates to a semiconductor device and relates to, for example, a technique effectively applicable to a semiconductor device provided with a semiconductor chip configured to transmit signals at a high speed.

BACKGROUND OF THE INVENTION

Japanese Patent Application Laid-Open Publication No. 2008-124398 (Patent Document 1) discloses a method of manufacturing a semiconductor device, in which a resin tape with a conductive foil on which micro wiring is formed by a subtractive method is adhered on a wiring layer formed by a build-up method.

Japanese Patent Application Laid-Open Publication No. 2013-514668 (Patent Document 2) discloses a structure in which a via and a wiring are joined without a via land interposed therebetween.

SUMMARY OF THE INVENTION

The inventors of the present application have been conducting technical development for improving performances of semiconductor devices. In a part of this technical development, the inventors are now engaged with technical development for densifying transmission paths for signals inputted to a semiconductor chip mounted on a wiring substrate or for signals outputted from the semiconductor chip.

Other problems and novel characteristics will be apparent from the description in this specification and attached drawings.

A semiconductor device according to an embodiment includes a wiring substrate provided with a plurality of pads electrically connected to a semiconductor chip by a flip-chip interconnection. The wiring substrate includes a pad forming layer and a first wiring layer located at a position closest to the pad forming layer. The pad forming layer includes a first pad configured to receive transmission of a first signal and a second pad configured to receive transmission of a second signal different from the first signal. A first via land overlapping with the first pad, a first wiring connected to the first via land, and a second wiring electrically connected to the second pad and extending in a first direction are formed in the first wiring layer. In a second direction intersecting the first direction, a width of the first via land is larger than a width of the first wiring. The second wiring is located adjacent to the first via land and overlaps with the first pad.

According to the embodiment described above, it is possible to improve the performance of the semiconductor device.

BRIEF DESCRIPTIONS OF THE DRAWINGS

FIG. 3 is a top view of one of two semiconductor devices in FIG. 1;

FIG. 4 is a bottom view of the semiconductor device in FIG. 3;

Figure 1:
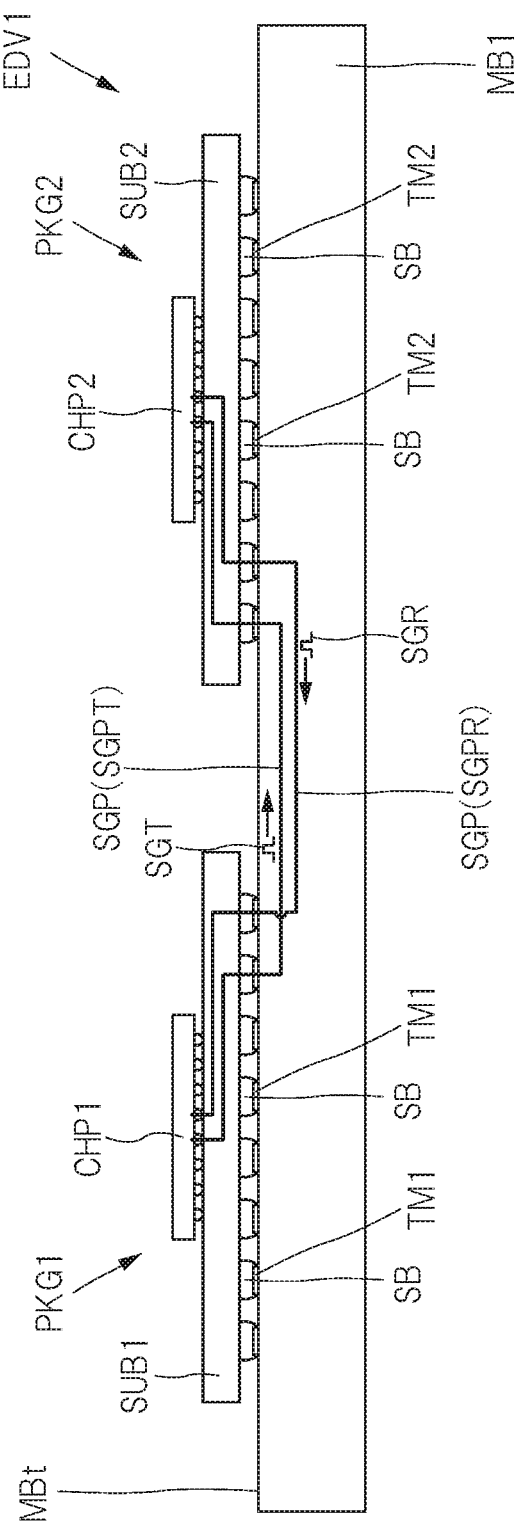
FIG. 1 is an explanatory drawing illustrating a configuration example of an electronic device.

DESCRIPTIONS OF THE PREFERRED EMBODIMENTS (Explanation of Description Form, Basic Terminology and Usage in Present Application)

In the present application, the embodiments will be described in a plurality of sections or the like when required as a matter of convenience. However, these sections or the like are not irrelevant to each other unless otherwise stated, and a part of one example relates to the other example as details or a part or the entire of a modification example regardless of the order of description. Also, the repetitive description of similar parts will be omitted in principle. Further, the constituent elements in the embodiments are not always indispensable unless otherwise stated or except for the case where the constituent elements are theoretically indispensable in principle or the constituent elements are obviously indispensable from the context.

Likewise, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context. Also, in the description below, even in a case where it is stated that a certain value and another value are the "same" or "equal", the meaning of "same" or "equal" is not limited to exactly the same or equal, and may include the case where there is an error within a range in which the values can be regarded as substantially equivalent.

Further, in the drawings for the embodiments, the same or similar parts are denoted by the same or similar reference character or reference number, and the descriptions thereof are not repeated in principle.

In addition, in the attached drawings, hatching may be omitted even in cross-sections in the case where the hatchings make the drawings complicated on the contrary or discrimination from void is clear. In relation to this, when it is clear from the description or the like, an outline of a background may be omitted even in a planarly closed hole. Furthermore, even in the cases other than the cross-section, hatching or dot pattern may be applied so as to clarify that a portion is not a vacant space or clearly illustrate the boundary between regions.

<Electronic Device>

Figure 2:
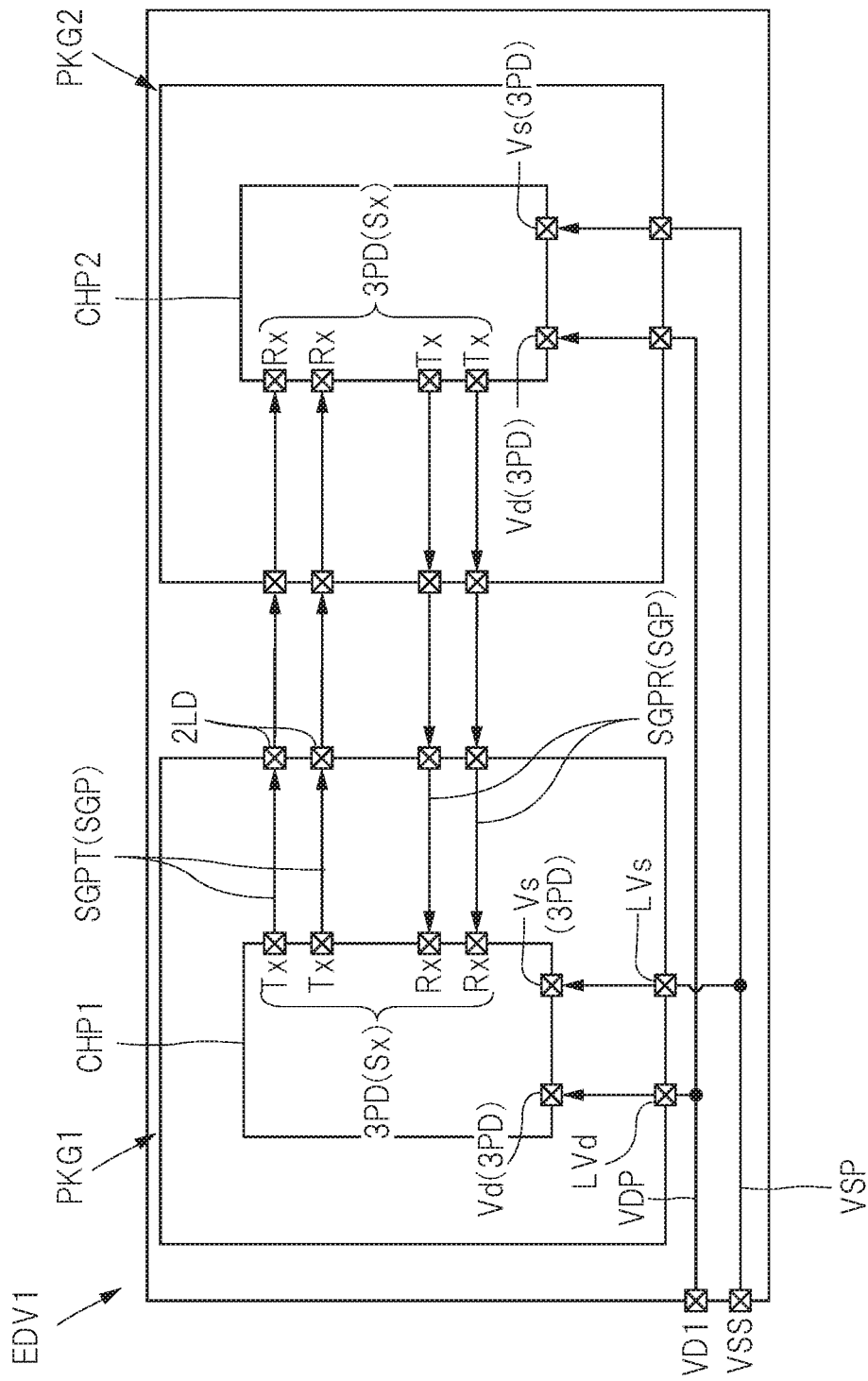
FIG. 2 is an explanatory drawing illustrating a configuration example of a circuit provided in the electronic device in FIG. 1.

First, with reference to FIG. 1 and FIG. 2, a configuration example of an electronic device which includes a plurality of semiconductor devices (semiconductor packages) mounted on a mother board and is configured to transmit electrical signals among the plurality of semiconductor devices will be described. FIG. 1 is an explanatory drawing illustrating a configuration example of the electronic device including the semiconductor devices of the present embodiment. Also, FIG. 2 is an explanatory drawing illustrating a configuration example of a circuit provided in the electronic device in FIG. 1. In FIG. 1, in order to explicitly illustrate that a semiconductor device PKG1 and a semiconductor device PKG2 are electrically connected, signal transmission paths SGP illustrated in FIG. 2 are schematically illustrated by thick lines.

An electronic device (electronic equipment) EDV1 illustrated in FIG. 1 includes a wiring board (mother board, mounting board) MB1 and the semiconductor devices PKG1 and PKG2 mounted on the wiring board MB1. The semiconductor device PKG1 and the semiconductor device PKG2 are electrically connected with each other through the signal transmission paths SGP formed on the wiring board MB1. Signals transmitted through the signal transmission paths SGP include a signal SGT outputted from the semiconductor device PKG1 and a signal SGR inputted to the semiconductor device PKG1. Also, the signal transmission paths SGP include a signal transmission path SGPT for transmitting the signal SGT and a signal transmission path SGPR for transmitting the signal SGR.

In the example illustrated in FIG. 1, the signal SGT is outputted from the semiconductor device PKG1 and is inputted to the semiconductor device PKG2. Also, the signal SGR is outputted from the semiconductor device PKG2 and is inputted to the semiconductor device PKG1. However, a destination of the signal SGT and an output source of the signal SGR are not limited to those in the example illustrated in FIG. 1, and various modifications are applicable. Since the semiconductor device PKG1 and the semiconductor device PKG2 illustrated in FIG. 1 have the same structure, the semiconductor device PKG1 will be described below as a representative example.

As illustrated in FIG. 2, the electronic device EDV1 includes the plurality of signal transmission paths SGP. The signal transmission paths SGP are, for example, high-speed transmission paths (high-speed signal transmission paths) in which the signals are transmitted at a transmission speed equal to or higher than 5 Gigabit per second (Gbps). In the present embodiment, transmission paths having a so-called single-end structure in which signals different from each other are transmitted respectively to the plurality of signal transmission paths SGP will be described as an example of the signal transmission paths SGP serving as high-speed transmission paths. However, the technique described below may be applied also to differential transmission paths configured to transmit a signal through a pair of signal transmission paths constituting a differential pair.

As illustrated in FIG. 2, a semiconductor chip (semiconductor component, electronic component) CHP1 provided in the semiconductor device PKG1 includes a plurality of electrodes. The plurality of electrodes provided on the semiconductor chip CHP1 include signal electrodes Tx for transmitting the signal SGT (see FIG. 1), which is an output signal (transmission signal). In addition, the plurality of electrodes provided on the semiconductor chip CHP1 include signal electrodes Rx each for transmitting the signal SGR (see FIG. 1), which is an input signal (receiving signal). In the following description, the signal electrodes Tx or the signal electrodes Rx may be collectively referred to as "signal electrodes Sx".

In FIG. 2, two of the output signal transmission paths SGPT and two of the input signal transmission paths SGPR are representatively illustrated among the plurality of signal transmission paths SGP provided in the semiconductor device PKG1. However, the number of the signal transmission paths SGP provided in the semiconductor device PKG1 is larger than the number illustrated in FIG. 2.

Further, the plurality of electrodes provided on the semiconductor chip CHP1 include an electrode (reference potential electrode, first potential electrode) Vs that receives a supply of a reference potential (first potential) VSS and an electrode (power supply potential electrode, second potential electrode) Vd that receives a supply of a power supply potential (second potential) VDD. The semiconductor chip CHP1 (specifically, a circuit provided in the semiconductor chip CHP1) receives a supply of the power supply potential VDD through the electrodes Vd. Also, the semiconductor chip CHP1 (specifically, a circuit provided in the semiconductor chip CHP1) receives a supply of the reference potential VSS through the electrode Vs. At least a part of the plurality of circuits provided in the semiconductor chip CHP1 is driven by a drive voltage generated by a potential difference between the power supply potential VDD and the reference potential VSS. The reference potential VSS is, for example, a ground potential, and the power supply potential VDD is higher than the reference potential VSS.

<Semiconductor Device>

Figure 5:
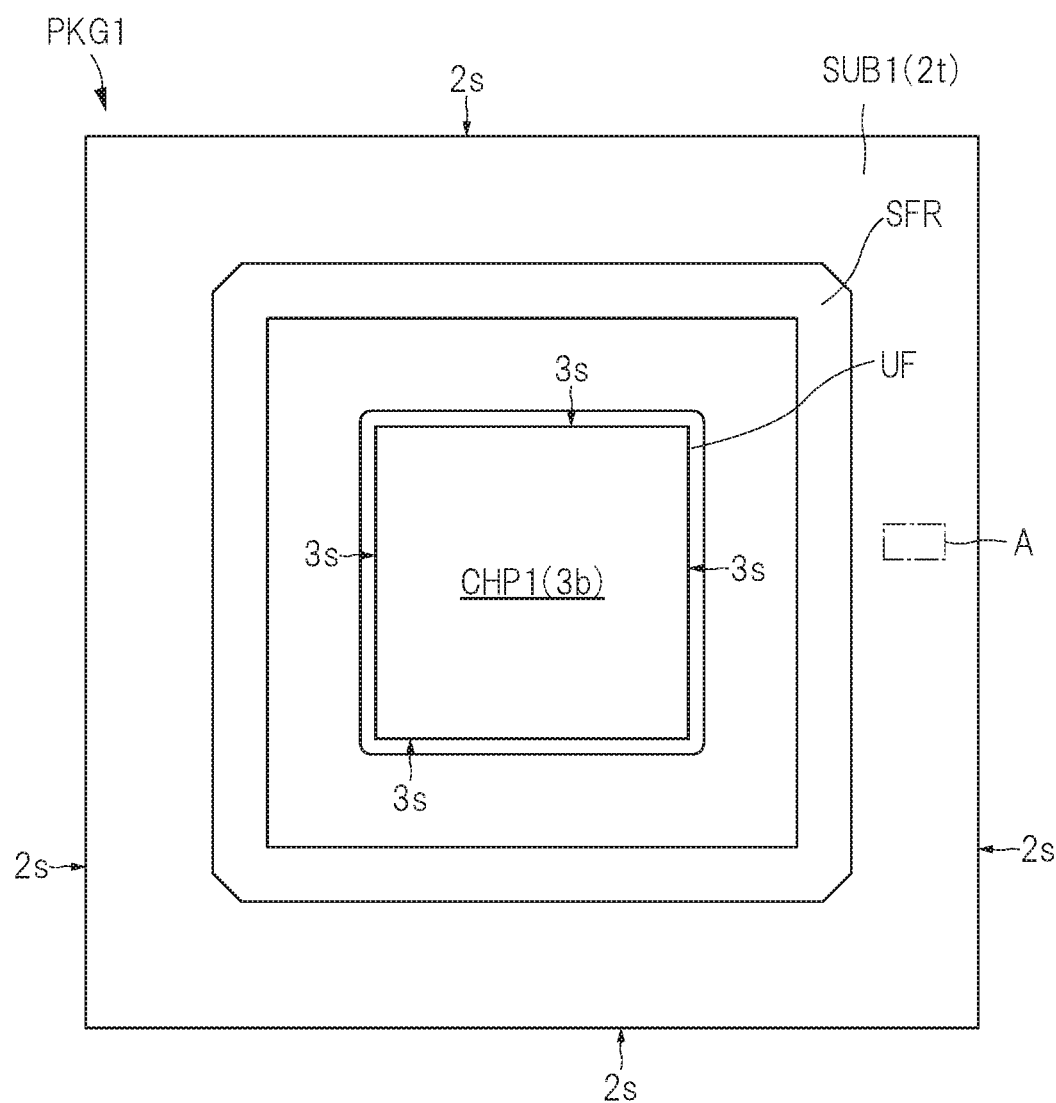
FIG. 5 is a plan view illustrating an internal structure of the semiconductor device on a wiring board in a state in which a heat dissipation plate in FIG. 3 is removed.
Figure 6:
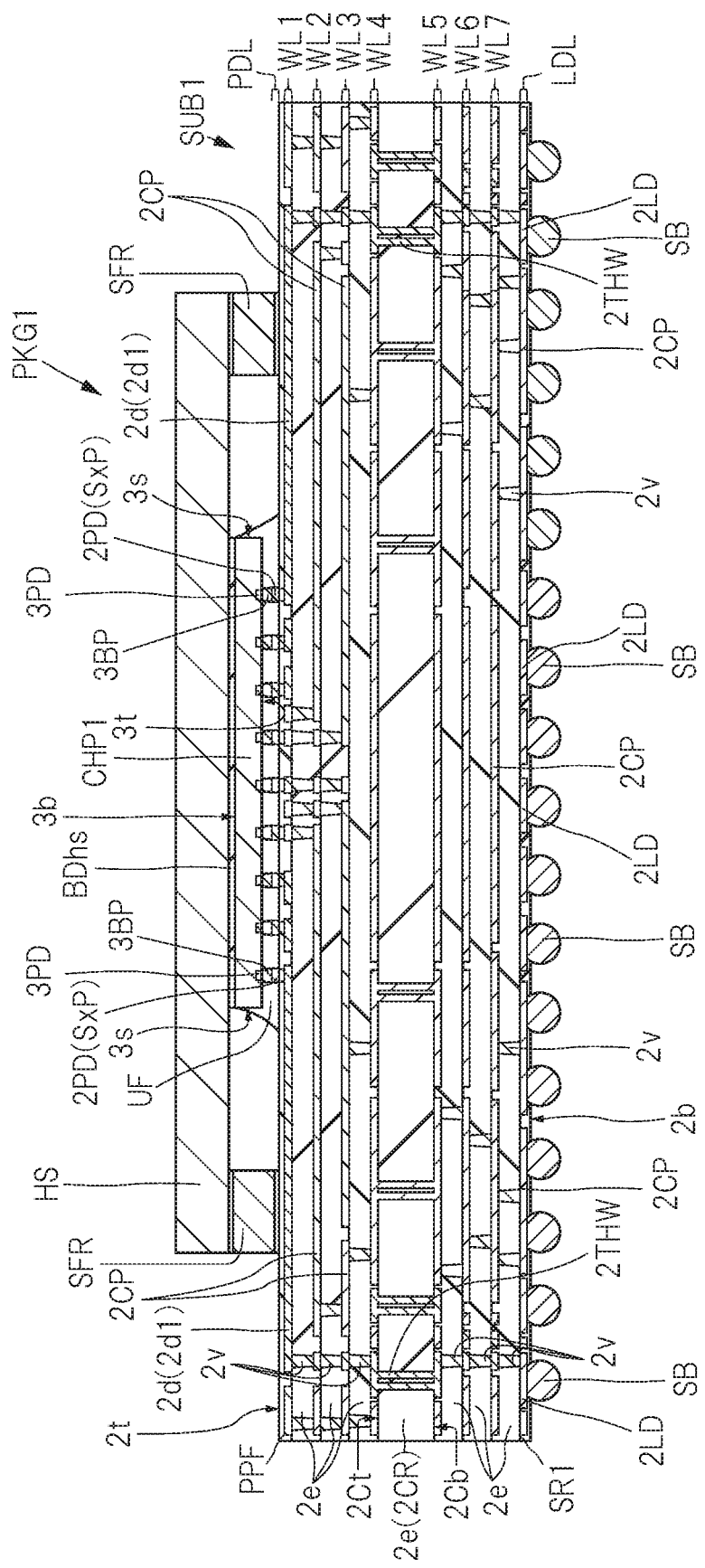
FIG. 6 is a cross-sectional view taken along a line A-A in FIG. 3.
Figure 7:
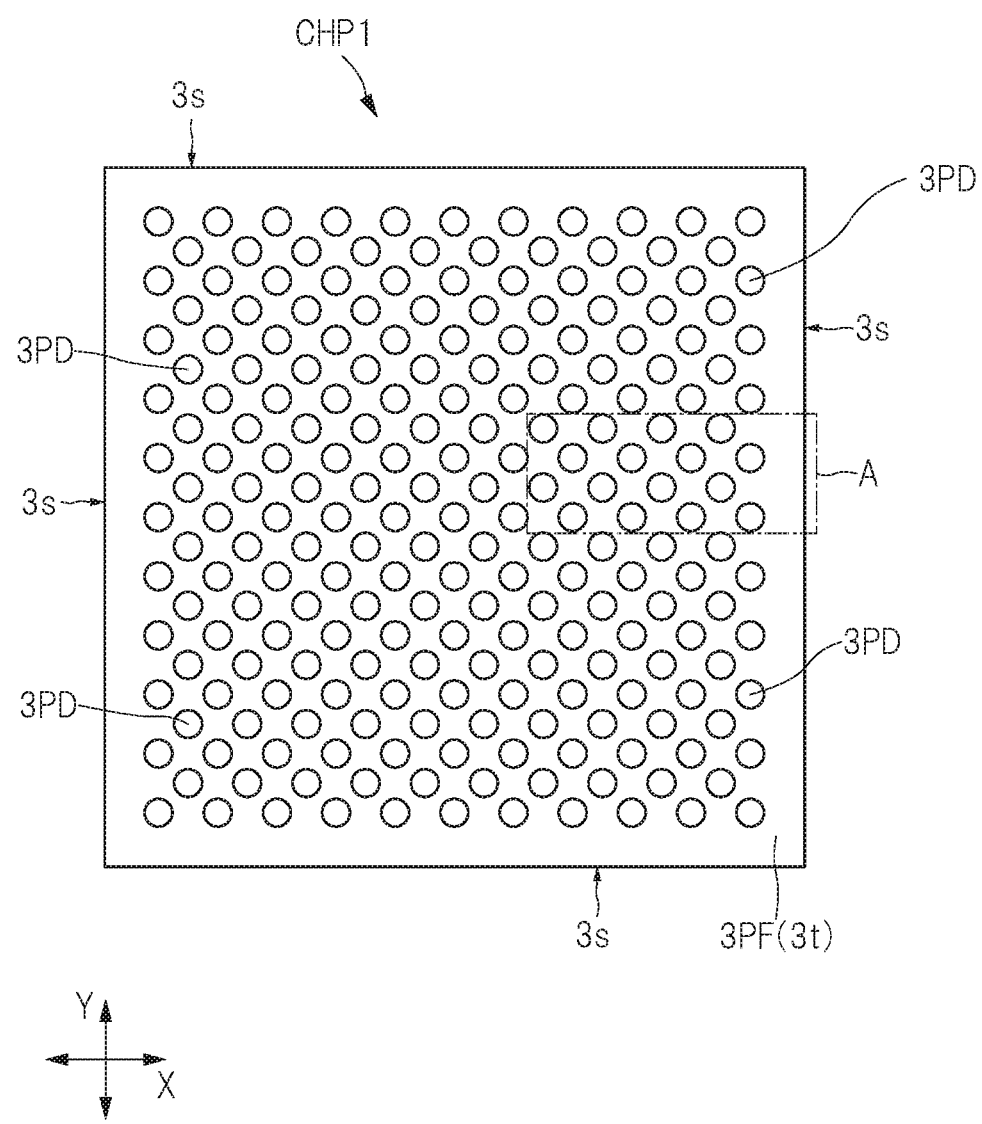
FIG. 7 is a plan view of an electrode arranging surface of the semiconductor chip illustrated in FIG. 6.

A structural example of the signal transmission paths in the semiconductor device PKG1 will be described using the semiconductor device PKG1 illustrated in FIG. 1 as an example. An outline of the semiconductor device PKG1 will be described first, and then a structure of the signal transmission paths will be described. FIG. 3 is a top view of one of the two semiconductor devices in FIG. 1. FIG. 4 is a bottom view of the semiconductor device in FIG. 3. Also, FIG. 5 is a plan view illustrating an internal structure of the semiconductor device on a wiring board in a state in which a heat dissipation plate in FIG. 3 is removed. FIG. 6 is a cross-sectional view taken along a line A-A in FIG. 3. FIG. 7 is a plan view of an electrode arranging surface of the semiconductor chip illustrated in FIG. 6.

The semiconductor device PKG1 of the present embodiment includes a wiring substrate SUB1 and the semiconductor chip CHP1 (see FIG. 5) mounted on the wiring substrate SUB1.

As illustrated in FIG. 6, the wiring substrate SUB1 includes an upper surface (surface, main surface, chip mounting surface, first main surface) 2t on which the semiconductor chip CHP1 is mounted and a lower surface (surface, main surface, mounting surface, second main surface) 2b on an opposite side from the upper surface 2t. Further, the wiring substrate SUB1 includes a plurality of side surfaces 2s (see FIG. 3 to FIG. 5) intersecting respective outer edges of the upper surface 2t and the lower surface 2b (see FIG. 3 to FIG. 5). In the case of the present embodiment, the upper surface 2t (see FIG. 3) and the lower surface 2b (see FIG. 4) of the wiring substrate SUB1 both have a square shape.

The wiring substrate SUB1 is an interposer (relay substrate) configured to electrically connect the semiconductor chip CHP1 mounted on the upper surface 2t and the wiring board MB1 (see FIG. 1) which is the mother board (mounting board) with each other. The wiring substrate SUB1 includes a plurality of wiring layers (seven layers in the example illustrated in FIG. 6) WL1, WL2, WL3, WL4, WL5, WL6, and WL7 configured to electrically connect terminals (pads 2PD) on the upper surface 2t which corresponds to the chip mounting surface and terminals (lands 2LD) on the lower surface 2b which corresponds to the mounting surface. The respective wiring layers are located between the upper surface 2t and the lower surface 2b. Each of the wiring layers includes conductor patterns such as wirings which are paths for supplying electrical signals and electric power. Also, insulating films 2e are disposed between the wiring layers. The wiring layers are electrically connected to each other through vias 2v or through-hole wirings 2THW, which are interlayer conducting paths penetrating through the insulating films 2e.

The wiring layer WL1 disposed on the side closest to the upper surface 2t among the plurality of wiring layers is covered with an insulating film (photosensitive polymer film) PPF made of a photosensitive resin. A pad forming layer (terminal forming layer) PDL in which a plurality of the pads 2PD are formed is provided on the insulating film PPF. Also, a land forming layer (terminal forming layer) LDL in which a plurality of lands to be electrically connected to the wiring layer WL7 are formed is provided on the lower surface 2b of the wiring substrate SUB1. The land forming layer LDL is covered with an insulating film SR1 which is a solder resist film. The plurality of pads 2PD provided in the pad forming layer PDL and the plurality of lands 2LD provided in the land forming layer LDL are electrically connected respectively through the conductor patterns (wirings 2d and conductor patterns 2CP), the vias 2v, and the through-hole wirings 2THW formed in the respective wiring layers provided in the wiring substrate SUB1.

Note that the plurality of vias 2v connected to the signal pads SxP and configured to electrically connect the respective wiring layers are illustrated to be stacked in FIG. 6 in order to clearly illustrate that the signal pads SxP are connected to the lands 2LD and solder balls SB through wirings 2d1, the plurality of vias 2v, and the through-hole wirings 2THW in one drawing. However, the layout of the plurality of vias 2v and the conductor patterns 2CP is not limited to the example in FIG. 6, and various modifications are applicable.

Also, the wiring substrate SUB1 is formed by, for example, stacking a plurality of wiring layers by a build-up method respectively on an upper surface 2Ct and a lower surface 2Cb of an insulating layer (core member, core insulating layer) 2CR made of a prepreg formed by impregnating glass fibers into a resin. Also, the wiring layer WL4 on the upper surface 2Ct of the insulating layer 2CR and the wiring layer WL5 on the lower surface 2Cb of the insulating layer 2CR are electrically connected through the plurality of through-hole wirings 2THW embedded in a plurality of through holes provided so as to penetrate from one of the upper surface 2Ct and the lower surface 2Cb to the other thereof.

In the pad forming layer PDL on the upper surface 2t of the wiring substrate SUB1, the plurality of pads (terminals, bonding pads, bonding leads, semiconductor chip connection terminals) 2PD to be electrically connected to the semiconductor chip CHP1 are formed. Further, in the land forming layer LDL on the lower surface 2b of the wiring substrate SUB1, the plurality of lands 2LD which are external I/O terminals of the semiconductor device PKG1 are formed. The plurality of pads 2PD and the plurality of lands 2LD are electrically connected respectively through the wirings 2d, the vias 2v, and the through-hole wirings 2THW formed in the wiring substrate SUB1. Detailed description of a connecting structure of the pads 2PD and the wiring layer WL1 will be given later.

In the example illustrated in FIG. 6, the wiring substrate SUB1 is illustrated as a wiring substrate including the plurality of wiring layers stacked on each of the upper surface 2Ct and the lower surface 2Cb of the insulating layer 2CR which is a core member. However, as a modification with respect to the structure illustrated in FIG. 6, it is also possible to adopt a so-called coreless substrate formed by stacking conductor patterns such as the insulating films 2e and the wirings 2d in sequence without providing the insulating layer 2CR made of a hard material such as the prepreg material. When the coreless substrate is used, the through-hole wirings 2THW are not formed, and the respective wiring layers are electrically connected with each other through the vias 2v. In FIG. 6, the wiring substrate SUB1 having the seven wiring layers is illustrated as an example. However, a wiring substrate having, for example, eight or more or six or less wiring layers may be adopted as a modification.

In the example illustrated in FIG. 6, the solder balls (solder materials, external terminals, electrodes, external electrodes) SB are connected to the plurality of lands 2LD, respectively. The solder balls SB are conductive members that electrically connect the plurality of terminals (not illustrate) on the wiring board MB1 and the plurality of lands 2LD when mounting the semiconductor device PKG1 on the wiring board MB1 illustrated in FIG. 1. The solder balls SB are made of, for example, a Sn—Pb solder material containing lead (Pb) or a so-called lead-free solder material containing substantially no lead (Pb). Examples of the lead-free solder include, for example, Tin (Sn) only, tin-bismuth (Sn—Bi), or tin-copper-silver (Sn—Cu—Ag), and tin-copper (Sn—Cu). Herein, the "lead-free solder" is intended to mean the solder containing lead (Pb) by an amount equal to or less than 0.1 wt %, and this amount is specified as a standard of Restriction of Hazardous Substances (RoHS) Directive.

As illustrated in FIG. 4, the plurality of solder balls SB are arranged in rows and columns (array pattern or matrix pattern). Although illustration is omitted in FIG. 4, the plurality of lands 2LD to which the plurality of solder balls SB are joined (see FIG. 6) are also arranged in rows and columns (matrix pattern). The semiconductor device having a plurality of external terminals (solder balls SB, lands 2LD) arranged in rows and columns on the mounting surface side of the wiring substrate SUB1 in this manner is referred to as "area array semiconductor device". The area array semiconductor device is preferable because the mounting surface (lower surface 2b) of the wiring substrate SUB1 can be effectively utilized as a space for arranging the external terminals and an increase in mounting area of the semiconductor device can be suppressed even when the number of external terminals increases. In other words, the semiconductor device in which the number of external terminals increases in association with higher functionality and higher integration can be mounted in a space saving manner.

The semiconductor device PKG1 is provided with the semiconductor chip CHP1 to be mounted on the wiring substrate SUB1. As illustrated in FIG. 6, each semiconductor chip CHP1 includes a front surface (main surface, upper surface) 3t and a back surface (main surface, lower surface) 3b on a side opposite from the front surface 3t. Further, the semiconductor chip CHP1 includes a plurality of side surfaces 3s intersecting the front surface 3t and the back surface 3b. As illustrated in FIG. 5, the semiconductor chip CHP1 has a square outer shape smaller in plane area than the wiring substrate SUB1 in plan view. In the example illustrated in FIG. 5, the semiconductor chip CHP1 is mounted on a central area of the upper surface 2t of the wiring substrate SUB1, and each of the four side surfaces 3s of the semiconductor chip CHP1 extends along each of the four side surfaces 2s of the wiring substrate SUB1.

As illustrated in FIG. 7, a plurality of electrodes (pads, electrode pads, bonding pads) 3PD are formed on the front surface 3t of the semiconductor chip CHP1. On the front surface 3t of the semiconductor chip CHP1, the plurality of electrodes 3PD are exposed from an insulating film (passivation film, protective insulating film) 3PF that covers major part of the front surface 3t of the semiconductor chip CHP1. On the front surface 3t, the plurality of electrodes 3PD are arrayed in a plurality of rows from an outermost periphery closest to outer edges of the front surface 3t toward the center of the front surface 3t. In the present embodiment, the plurality of electrodes 3PD are arranged in rows and columns (matrix pattern, array pattern) on the front surface 3t of the semiconductor chip CHP1. By arranging the plurality of electrodes 3PD of the semiconductor chip CHP1 in rows and columns, the front surface 3t of the semiconductor chip CHP1 can be effectively utilized as a space for arranging the electrodes. Therefore, it is preferable in that an increase in plane area can be suppressed even when the number of electrodes of the semiconductor chip CHP1 increases. However, although illustration is omitted, the semiconductor chip including the plurality of electrodes 3PD arranged in a peripheral edge portion of the front surface 3t but not in a central area is also applicable as a modification of the present embodiment.

In the example illustrated in FIG. 6, the semiconductor chip CHP1 is mounted on the wiring substrate SUB1 in a state in which the front surface 3t faces the upper surface 2t of the wiring substrate SUB1. Such a mounting method is referred to as "face-down mounting method" or "flip-chip interconnection".

Although illustration is omitted, a plurality of semiconductor elements (circuit elements) are formed on the main surface of the semiconductor chip CHP1 (specifically, a semiconductor element forming region provided on an element forming surface of a semiconductor substrate serving as a base member of the semiconductor chip CHP1). The plurality of electrodes 3PD are electrically connected to the plurality of semiconductor elements through wirings (illustration is omitted) formed in the wiring layers provided in an interior of the semiconductor chip CHP1 (specifically, between the front surface 3t and the semiconductor element forming region (not illustrated)).

The semiconductor chip CHP1 (specifically, the base member of the semiconductor chip CHP1) is made of, for example, silicon (Si). In addition, the insulating film 3PF (see FIG. 7) that covers the base member and the wirings of the semiconductor chip CHP1 is formed on the front surface 3t, and part of each of the plurality of electrodes 3PD is exposed from the insulating film from openings formed in the insulating film 3PF. Also, the plurality of electrodes 3PD are each made of a metal, and are made of, for example, aluminum (Al) in the present embodiment.

Also, as illustrated in FIG. 6, a projecting electrode 3BP is connected to each of the plurality of electrodes 3PD, and the plurality of electrodes 3PD of the semiconductor chip CHP1 and the plurality of pads 2PD of the wiring substrate SUB1 are electrically connected respectively through a plurality of the projecting electrodes 3BP. The projecting electrodes (bump electrodes) 3BP are metal members (conductive members) formed so as to project on the front surface 3t of the semiconductor chip CHP1. The projecting electrodes 3BP in the present embodiment are so-called solder bumps configured by stacking a solder material on the electrodes 3PD via an underlying metal film (underlying bump metal). Examples of the underlying metal film may include, for example, a stacked film configured by stacking titanium (Ti), copper (Cu), and nickel (Ni) from a side of a connecting surface with the electrodes 3PD (a gold (Au) film may further be formed on the nickel film). Also, examples of the solder material that constitutes the solder bumps may include a solder material containing lead and a lead-free solder as with the above-described solder balls SB. When the semiconductor chip CHP1 is mounted on the wiring substrate SUB1, the solder bumps are formed in advance on both the plurality of electrodes 3PD and the plurality of pads 2PD, and heat treatment (reflow process) is applied in a state in which the solder bumps are in contact with each other, so that both the solder bumps are integrated and the projecting electrodes 3BP are formed. As a modification with respect to the present embodiment, it is possible to adopt pillar bumps (pillar-shaped electrodes) configured by forming a solder film on distal end surfaces of the conductive pillars made of copper (Cu) or nickel (Ni) as the projecting electrodes 3BP.

Further, as illustrated in FIG. 6, an underfill resin (insulative resin) UF is arranged between the semiconductor chip CHP1 and the wiring substrate SUB1. The underfill resin UF is disposed so as to fill a space between the front surface 3t of the semiconductor chip CHP1 and the upper surface 2t of the wiring substrate SUB1. Each of the plurality of projecting electrodes 3BP is sealed by the underfill resin UF. The underfill resin UF is made of an insulative (non-conductive) material (for example, a resin material), and is disposed so as to seal electrically connected portions (joint portions of the plurality of projecting electrodes 3BP) between the semiconductor chip CHP1 and the wiring substrate SUB1. By covering the joint portions between the plurality of projecting electrodes 3BP and the plurality of pads 2PD with the underfill resin UF in this manner, stresses generated at electrically connected portions between the semiconductor chip CHP1 and the wiring substrate SUB1 may be relaxed. In addition, stresses generated at joint portions between the plurality of electrodes 3PD of the semiconductor chip CHP1 and the plurality of projecting electrodes 3BP can also be relaxed. Furthermore, the main surface of the semiconductor chip CHP1 where the semiconductor elements (circuit elements) are formed can be protected.

In the example illustrated in FIG. 6, a heat dissipation plate (heat spreader, heat dissipation member) HS is adhered to the back surface 3b of the semiconductor chip CHP1. The heat dissipation plate HS is, for example, a metal plate having a higher heat conductivity than the wiring substrate SUB1, and has a function to dissipate heat generated in the semiconductor chip CHP1 to the outside. Also, the heat dissipation plate HS is adhered to the back surface 3b of the semiconductor chip CHP1 via an adhesive material (heat dissipation resin) BDhs. The adhesive material BDhs has a higher heat conductivity than the underfill resin UF by containing, for example, a number of metal particles or fillers (for example, alumina).

In the example illustrated in FIG. 3 and FIG. 6, a supporting frame (stiffener ring) SFR configured to support the heat dissipation plate HS is fixed around the semiconductor chip CHP1. The heat dissipation plate HS is adhesively fixed to the back surface 3b of the semiconductor chip CHP1 and the supporting frame SFR. Fixing the metal supporting frame SFR around the semiconductor chip CHP1 is preferable in terms of improvement of mounting reliability because warping or deformation of the wiring substrate SUB1 can be suppressed. In addition, the plane area of the heat dissipation plate HS can be increased by adhesively fixing the heat dissipation plate HS to the supporting frame SFR provided so as to surround the periphery of the semiconductor chip CHP1. In other words, it is preferable to adhesively fix the heat dissipation plate HS to the supporting frame SFR in terms of improving the heat dissipation properties by the heat dissipation plate HS having a large surface area and stably fixing the heat dissipation plate HS on the semiconductor chip CHP1.

Note that although the mode in which the heat dissipation plate HS is adhered to the back surface 3b of the semiconductor chip CHP1 has been described as an example in the present embodiment, a mode in which the back surface 3b of the semiconductor chip CHP1 is exposed without attaching the heat dissipation plate HS is also applicable as a modification. As another modification with respect to the present embodiment, a heat dissipation plate in which portions corresponding to the heat dissipation plate HS and the supporting frame SFR are integrally formed may be adhered onto the semiconductor chip CHP1.

<Structural Example Around Pads>

Figure 8:
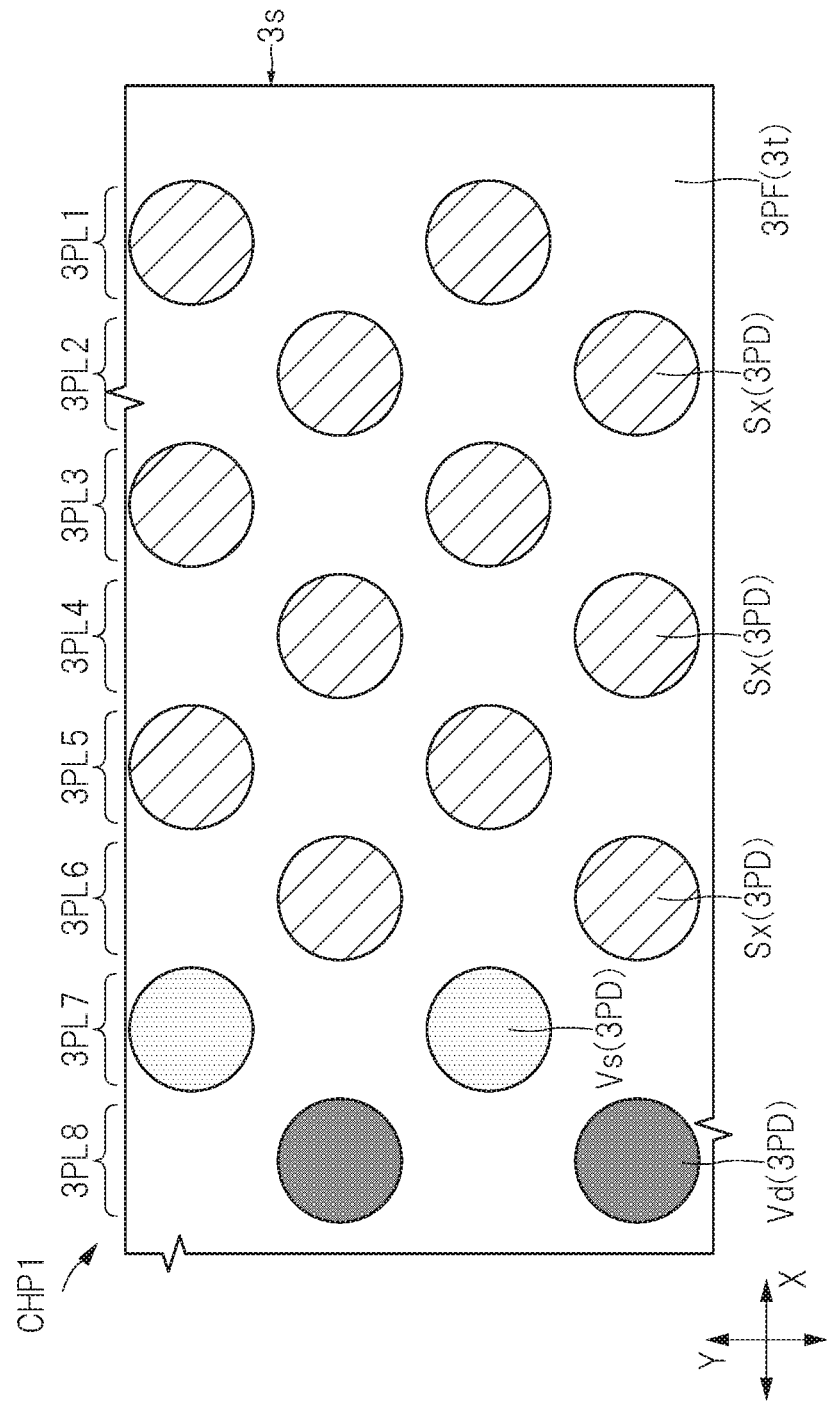
FIG. 8 is an enlarged plan view of a portion A in FIG. 7.
Figure 9:
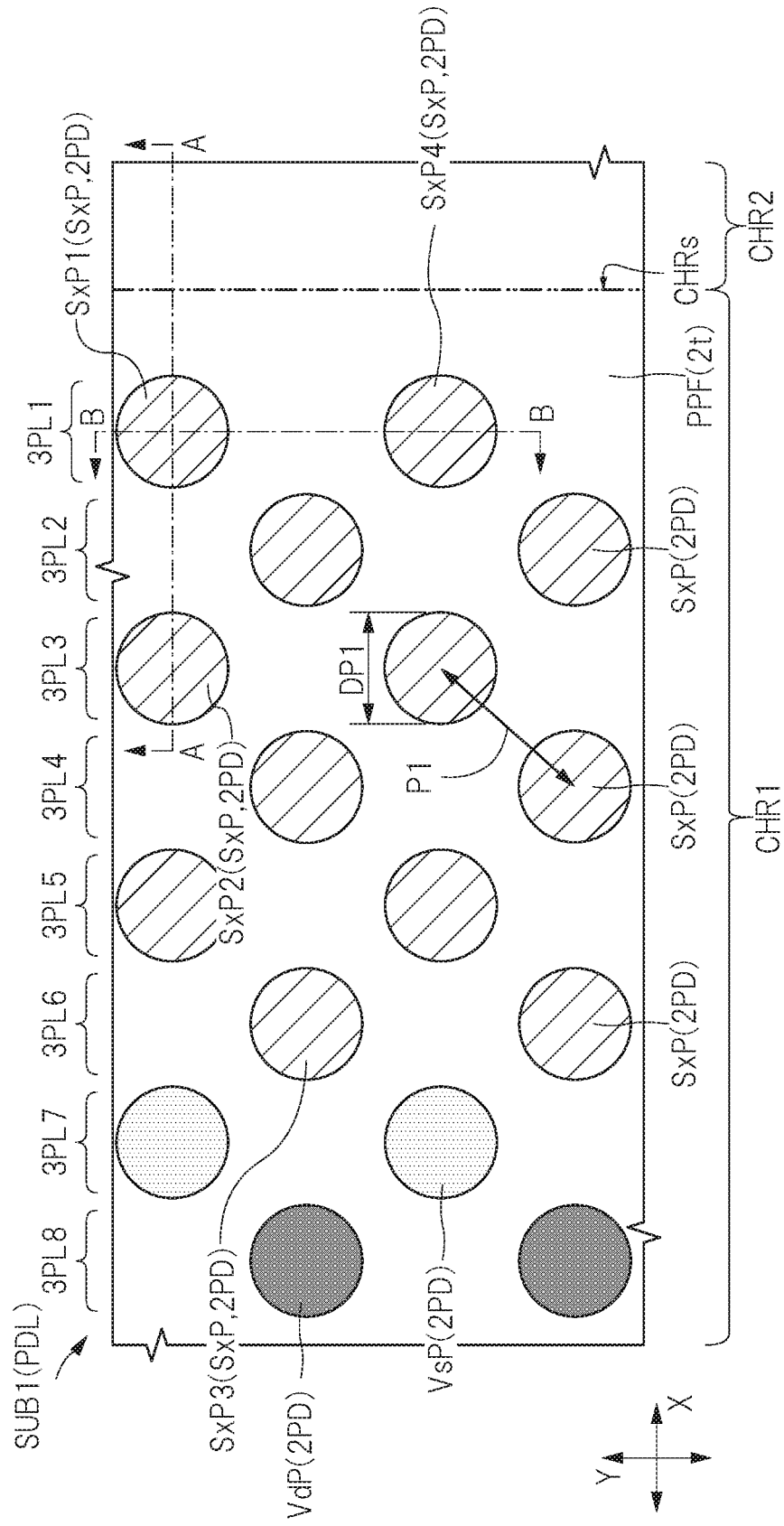
FIG. 9 is an enlarged plan view of an upper surface of the wiring substrate in FIG. 6, illustrating a periphery of terminals (pads) opposing a plurality of electrodes in FIG. 8 in an enlarged manner.
Figure 10:
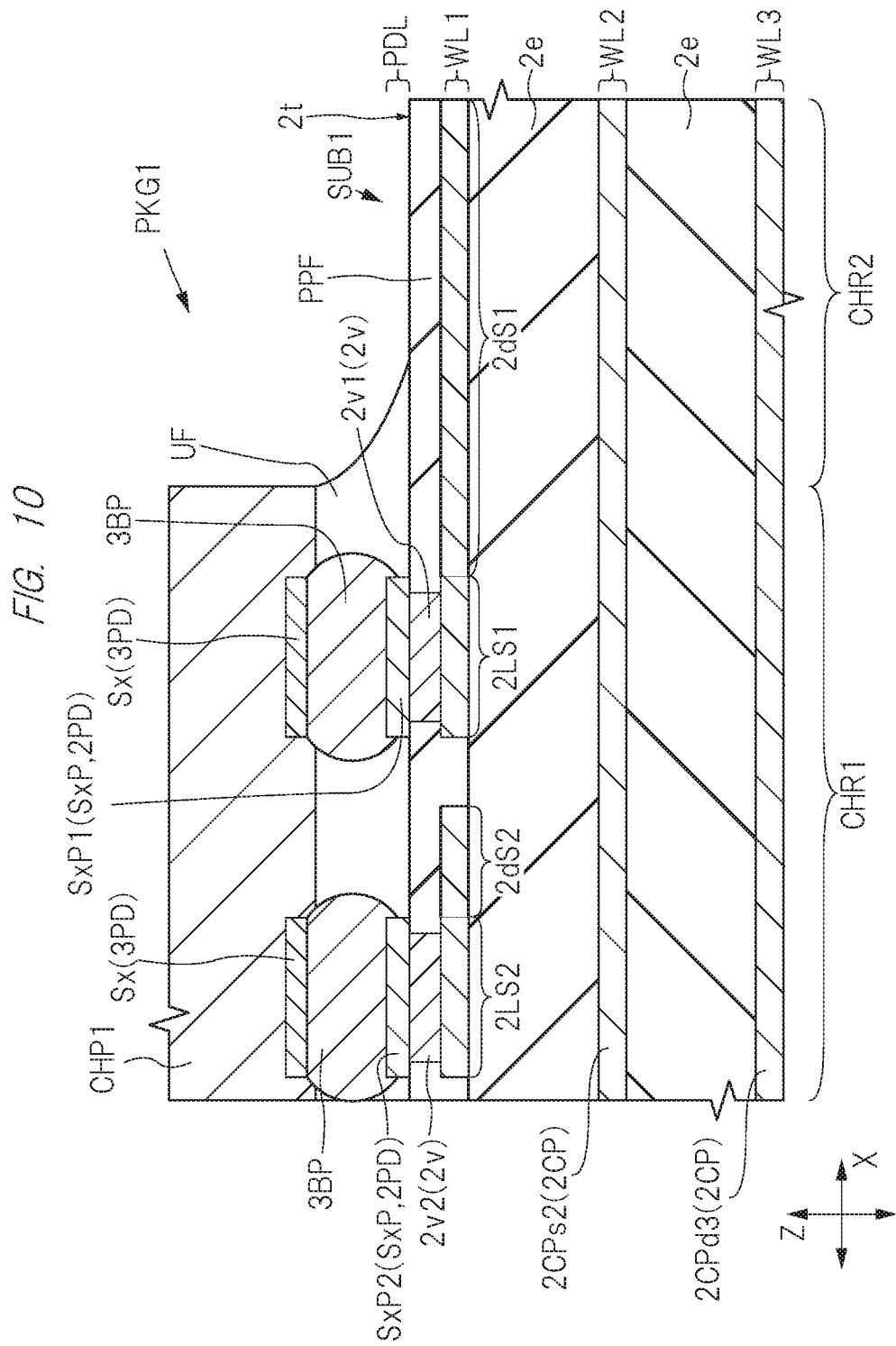
FIG. 10 is an enlarged cross-sectional view taken along a line A-A in FIG. 9.
Figure 11:
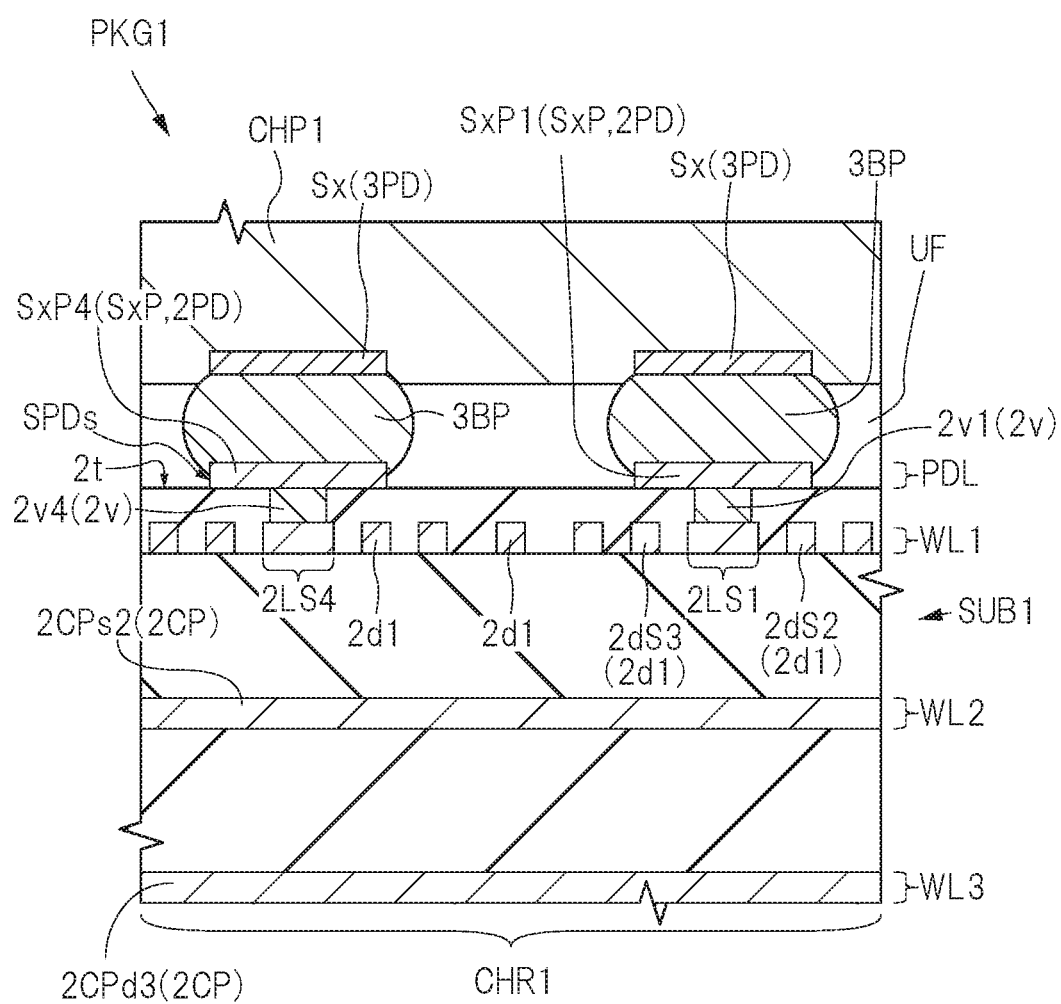
FIG. 11 is an enlarged cross-sectional view taken along a line B-B in FIG. 9.
Figure 12:
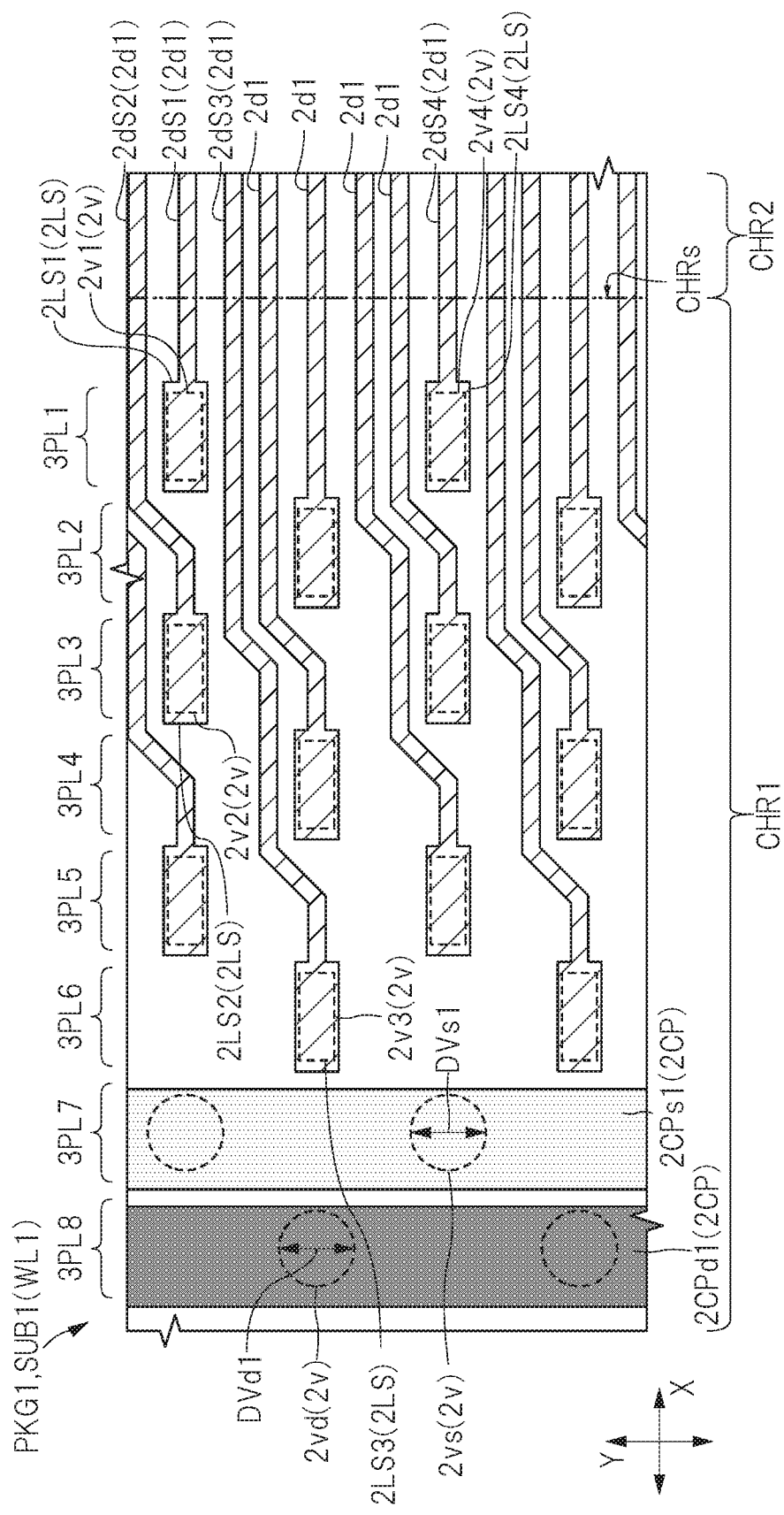
FIG. 12 is an enlarged plan view illustrating a second wiring layer in FIG. 6 on the same plane as FIG. 9.
Figure 13:
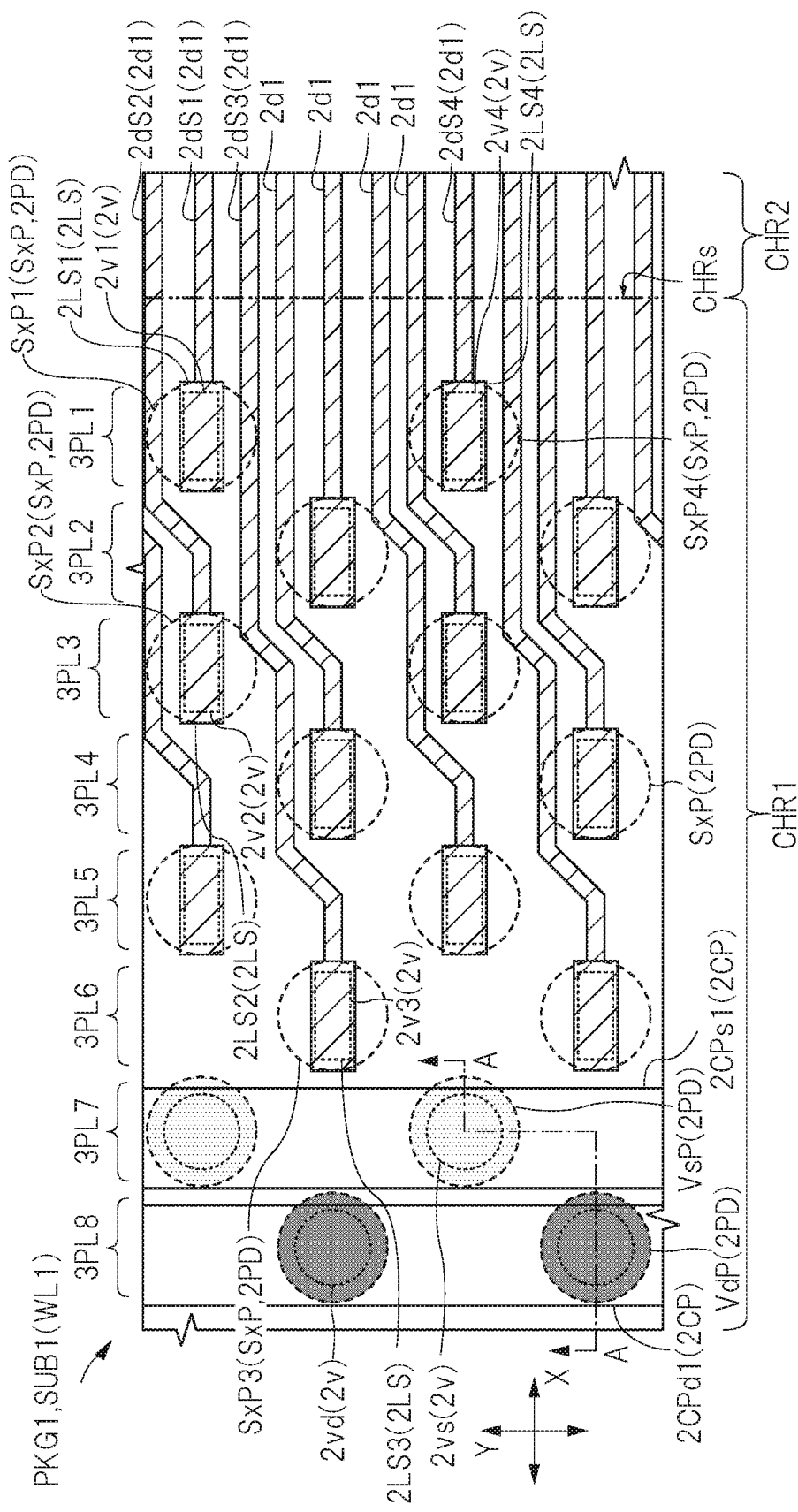
FIG. 13 is an enlarged plan view illustrating a positional relationship among pads, vias, via lands, wirings, and conductor patterns illustrated in FIG. 10 in plan view.
Figure 14:
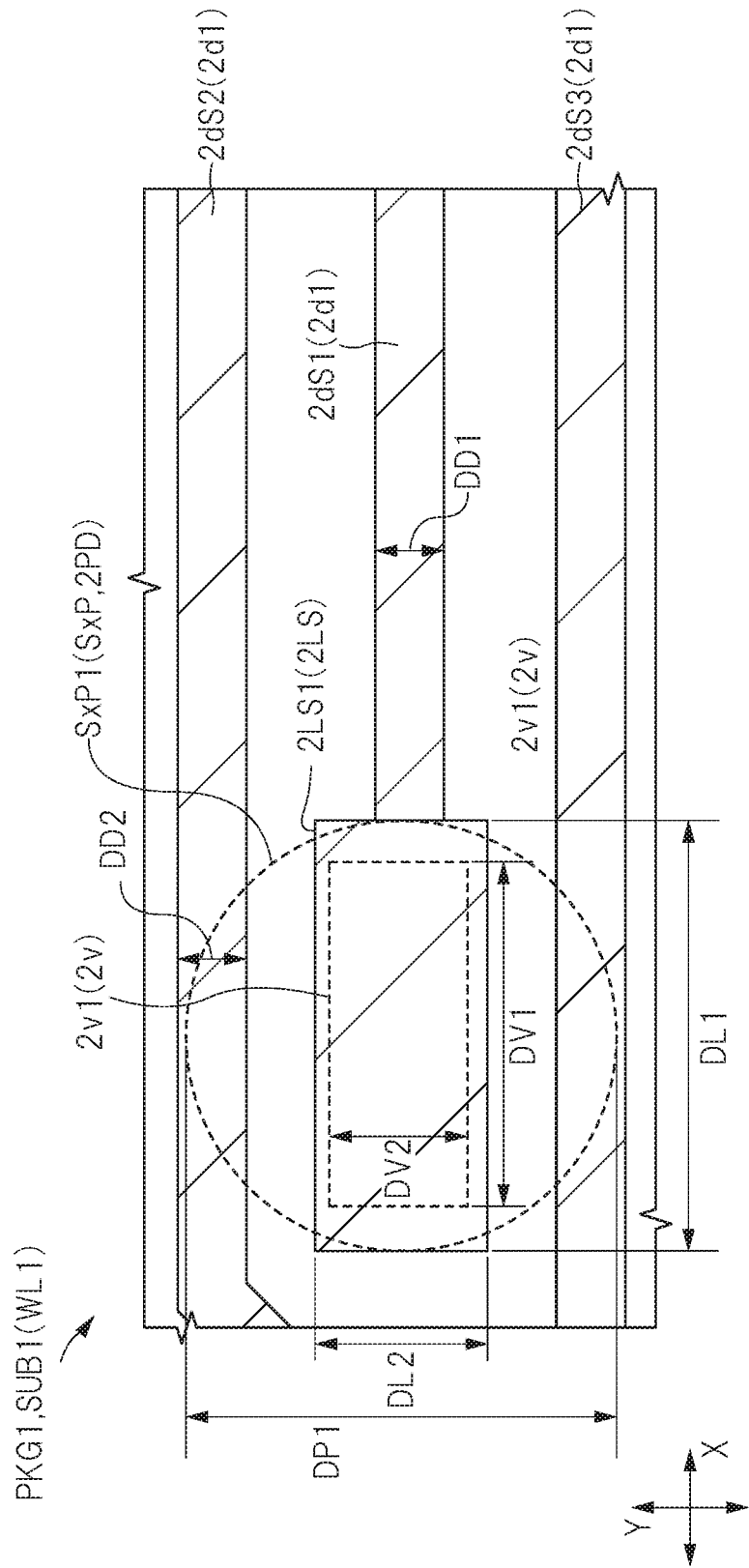
FIG. 14 is an enlarged plan view of one of a plurality of signal transmission paths in FIG. 13 illustrated in a further enlarged manner.
Figure 15:
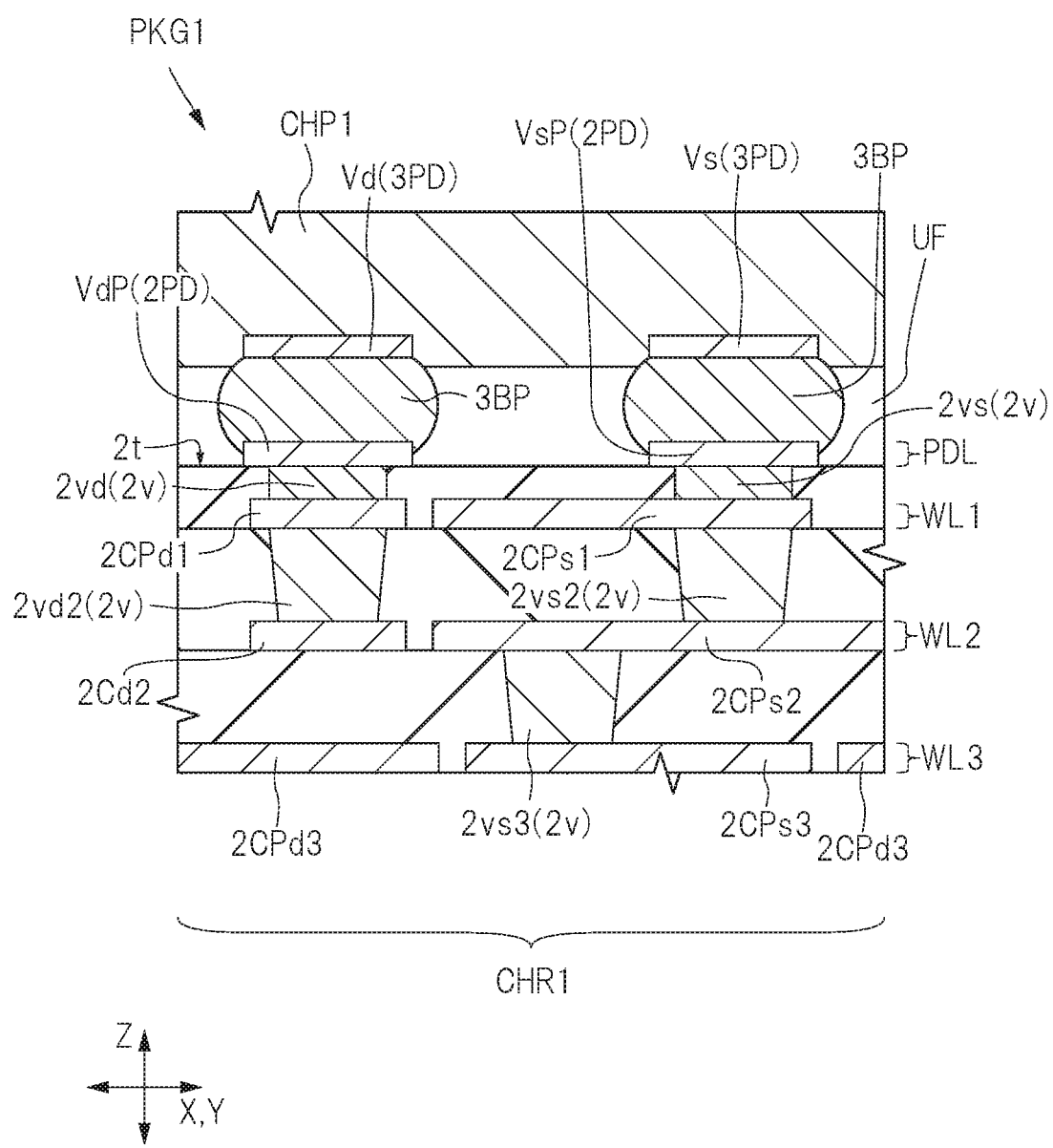
FIG. 15 is an enlarged cross-sectional view taken along a line A-A in FIG. 13.

Next, a connecting structure between the plurality of pads 2PD provided in the semiconductor device PKG1 illustrated in FIG. 6 and the wiring layer WL1 will be described in detail. FIG. 8 is an enlarged plan view of a portion A in FIG. 7. FIG. 9 is an enlarged plan view of an upper surface of the wiring substrate in FIG. 6, illustrating a periphery of terminals (pads) opposing a plurality of electrodes in FIG. 8 in an enlarged manner. FIG. 10 is an enlarged cross-sectional view taken along a line A-A in FIG. 9. FIG. 11 is an enlarged cross-sectional view taken along a line B-B in FIG. 9. FIG. 12 is an enlarged plan view illustrating a second wiring layer in FIG. 6 on the same plane as FIG. 9. FIG. 13 is an enlarged view illustrating a positional relationship among pads, vias, via lands, wirings, and conductor patterns illustrated in FIG. 10 in plan view. FIG. 14 is an enlarged plan view of one of a plurality of signal transmission paths in FIG. 13 illustrated in a further enlarged manner. FIG. 15 is an enlarged cross-sectional view taken along a line A-A in FIG. 13.

The upper surface 2t of the wiring substrate SUB1 and each of the plurality of wiring layers illustrated in FIG. 6 have a region (first region) CHR1 overlapping with the semiconductor chip CHP1 (see FIG. 9) and a region (second region) CHR2 located around the region CHR1 without overlapping with the semiconductor chip CHP1 (see FIG. 9). In FIG. 9, FIG. 12, and FIG. 13, an outer edge side CHRs of the region CHR1 is indicated by a two-dot chain line. Also, in FIG. 8, FIG. 9, FIG. 12, FIG. 13, and FIG. 14, hatching and patterns are provided for distinguishing types of signals and potentials to be supplied to the respective transmission paths. The transmission paths for the output signals (transmission signals) and the transmission paths for the input signals (receiving signals) are hatched, respectively. Further, the transmission paths for the reference potential are patterned with dots, and the transmission paths for the power supply potential are patterned with dots denser than those of the transmission paths for the reference potential. In FIG. 12, FIG. 13, and FIG. 14, the plurality of vias configured to electrically connect the pad forming layer PDL and the wiring layer WL1 illustrated in FIG. 6 are indicated by dot lines. In FIG. 13, the via lands and the plurality of wirings to be arranged in the wiring layer WL1 are indicated by solid lines, and the plurality of pads 2PD are indicated by dot lines.

As described above with reference to FIG. 2, the plurality of electrodes 3PD provided in the semiconductor chip CHP1 includes the plurality of signal electrodes Sx that constitute the signal transmission paths. Specifically, the signal electrodes Sx include the signal electrodes Tx for transmitting the signal SGT which is an output signal (see FIG. 1) and the signal electrodes Rx for transmitting the signal SGR which is an input signal (see FIG. 1). In addition, the plurality of electrodes 3PD of the semiconductor chip CHP1 include the electrodes Vd for receiving the supply of the power supply potential VDD and the electrodes Vs for receiving the supply of the reference potential VSS.

As illustrated in FIG. 8, the plurality of electrodes 3PD are arrayed in a plurality of rows on the front surface 3t of the semiconductor chip CHP1. Specifically, the semiconductor chip CHP1 includes a row (first row) 3PL1, a row (second row) 3PL2, a row (third row) 3PL3, a row (fourth row) 3PL4, a row (fifth row) 3PL5, a row (sixth row) 3PL6, a row (seventh row) 3PL7, and a row (eighth row) 3PL8 arrayed from the outer edge of the front surface 3t toward the center of the front surface 3t along an X direction in sequence. The row 3PL1 is located between the outer edge of the front surface 3t and the center of the front surface 3t. The row 3PL2 is located between the row 3PL1 and the center of the front surface 3t. The row 3PL3 is located between the row 3PL2 and the center of the front surface 3t. The row 3PL4 is located between the row 3PL3 and the center of the front surface 3t. The row 3PL5 is located between the row 3PL4 and the center of the front surface 3t. The row 3PL6 is located between the row 3PL5 and the center of the front surface 3t. The row 3PL7 is located between the row 3PL6 and the center of the front surface 3t. The row 3PL8 is located between the row 3PL7 and the center of the front surface 3t.

In each of the rows 3PL1 to 3PL6, the plurality of signal electrodes Sx are arrayed along a Y direction intersecting (orthogonal to, in FIG. 8) the X direction. In the row 3PL7, the plurality of electrodes Vs are arrayed along the Y direction. In the row 3PL8, the plurality of electrodes Vd are arrayed along the Y direction.

As illustrated in FIG. 6, the wiring substrate SUB1 includes the pad forming layer PDL, in which the plurality of pads 2PD are formed, in an uppermost layer opposing the semiconductor chip CHP1. As illustrated in FIG. 9, the pad forming layer PDL includes the plurality of pads 2PD arrayed therein. The plurality of pads 2PD oppose the plurality of electrodes 3PD illustrated in FIG. 6 with each other. The plurality of pads 2PD of the wiring substrate SUB1 include the plurality of signal pads SxP which constitute the signal transmission paths. Also, the plurality of pads 2PD of the wiring substrate SUB1 include pads (reference potential pad, first potential pad) VsP configured to receive a supply of the reference potential VSS and pads (power supply potential pad, second potential pad) VdP configured to receive a supply of the power supply potential VDD. The plurality of signal pads SxP oppose the plurality of signal electrodes Sx illustrated in FIG. 8 with each other. Each of the plurality of pads VdP illustrated in FIG. 9 opposes each of the plurality of electrodes Vd illustrated in FIG. 8. Each of the plurality of pads VsP illustrated in FIG. 9 opposes each of the plurality of electrodes Vs illustrated in FIG. 8.

Further, as illustrated in FIG. 9, the plurality of pads 2PD are arrayed in a plurality of rows on the upper surface 2t of the wiring substrate SUB1. Specifically, the wiring substrate SUB1 includes a row (first row) 3PL1, a row (second row) 3PL2, a row (third row) 3PL3, a row (fourth row) 3PL4, a row (fifth row) 3PL5, a row (sixth row) 3PL6, a row (seventh row) 3PL7, and a row (eighth row) 3PL8 arrayed from the outer edge side CHRs of the region CHR1 toward the center of the region CHR1 along the X direction in sequence. The row 3PL1 is located between the outer edge of the upper surface 2t and the center of the region CHR1. The row 3PL2 is located between the row 3PL1 and the center of the region CHR1. The row 3PL3 is located between the row 3PL2 and the center of the region CHR1. The row 3PL4 is located between the row 3PL3 and the center of the region CHR1. The row 3PL5 is located between the row 3PL4 and the center of the region CHR1. The row 3PL6 is located between the row 3PL5 and the center of the region CHR1. The row 3PL7 is located between the row 3PL6 and the center of the region CHR1. The row 3PL8 is located between the row 3PL7 and the center of the region CHR1.

In each of the rows 3PL1 to 3PL6, the plurality of signal pads SxP are arrayed in the Y direction intersecting (orthogonal to, in FIG. 9) the X direction. In the row 3PL7, the plurality of pads VsP are arrayed in the Y direction. In the row 3PL8, the plurality of pads VdP are arrayed in the Y direction.

Incidentally, in the case of the semiconductor device provided with a number of signal transmission paths as in the present embodiment, the wirings 2d (see FIG. 6) connected respectively to a number of the signal pads SxP (see FIG. 9) are arranged so as to spread from the region CHR1 toward the region CHR2 illustrated in FIG. 9. By arranging a number of the wirings 2d so as to extend across the region CHR1 and the region CHR2, a number of the signal transmission paths connected to the signal pads SxP can be led out from the region CHR1 to the region CHR2.

The inventors of the present application studied about miniaturization (densification) of the semiconductor chip CHP1 (see FIG. 8) in a part of the improvement in performance of the semiconductor device PKG1. When miniaturizing the semiconductor chip CHP1, densification of the layout of the plurality of electrodes 3PD of the semiconductor chip CHP1 (see FIG. 8) is required. Also, when the arrangement pitch of the electrodes 3PD is narrowed, a technique for narrowing the arrangement pitch of the pads 2PD including the signal pads SxP of the wiring substrate SUB1 arranged so as to oppose the electrodes 3PD (see FIG. 9) is required. For example, in the case of the example illustrated in FIG. 9, a pitch P1 between centers of the adjacent signal pads SxP is 100 μm.

However, when the pitch P1 of the signal pads SxP is narrowed, it becomes difficult to arrange the signal wirings between the adjacent signal pads SxP. For example, when a number of the signal wirings to be connected to the plurality of signal pads SxP are arranged in the same wiring layer as the signal pads SxP, the plurality of signal wirings need to be arranged between the adjacent signal pads SxP.

In addition, when the signal pads SxP are arrayed in a plurality of rows as illustrated in FIG. 9, the method of increasing the number of the wiring layers and forming the wirings 2d to be connected to the signal pads SxP in the plurality of wiring layers is conceivable. Since the signal pads S×P arrayed in the plurality of rows are connected to the plurality of wiring layers, the vias are stacked immediately under the plurality of signal pads SxP in the direction of thickness of the wiring substrate. For example, as an example of study with respect to the semiconductor device PKG1 illustrated in FIG. 9, a case of leading a number of the signal transmission paths including the signal pads SxP arrayed in six rows in the three wiring layers will be studied. In this example of study, when the respective wiring layers are formed by the build-up method, at least twelve wiring layers are necessary in addition to the pad forming layers PDL and LDL. Also, when considering a countermeasure against noise for the signal transmission paths, for example, the number of the wiring layers is further increased.

In the manufacturing process of the semiconductor device, if the number of the wiring layers of the wiring substrate is large, the manufacturing process becomes complicated. In addition, when the number of the wiring layers of the wiring substrate is large, processing becomes difficult, and thus product reliability tends to be lowered. Therefore, in terms of efficiency of the manufacturing process or improvement of product reliability, smaller number of wiring layers is preferable.

Accordingly, the inventors of the present application studied about a technique that can reduce the number of wiring layers even when the array pitch of the adjacent signal pads SxP is narrowed in association with miniaturization (densification) of the semiconductor chip CHP1 (see FIG. 8). Consequently, the inventors found that the number of wiring layers can be reduced by the structure of the semiconductor device PKG1 described below in detail. In the case of the semiconductor device PKG1, the pad forming layer PDL in which the plurality of signal pads SxP are formed and the wiring layer WL1 in which the plurality of wirings (first-layer wirings) 2d1 to be connected to the signal pads SxP are arranged are formed in different layers. In addition, in the case of the semiconductor device PKG1, the signal pads SxP are overlapped with the plurality of wirings 2d1.

As illustrated in FIG. 10, the wiring substrate SUB1 includes the pad forming layer PDL in which the plurality of pads 2PD are formed and the wiring layer WL1 located at a position closest to the pad forming layer PDL among the plurality of wiring layers. As illustrated in FIG. 12, the plurality of conductor patterns arranged at positions overlapped with the plurality of pads 2PD in plan view (see FIG. 13) and electrically connected to the plurality of pads 2PD through the vias 2v and the plurality of wirings 2d1 connected to the plurality of conductor patterns are formed in the wiring layer WL1. Each of the plurality of wirings 2d1 is a lead wiring from the region CHR1 to the region CHR2 and extends across the region CHR1 and the region CHR2.

As illustrated in FIG. 9, the plurality of pads 2PD include a signal pad (first pad) SxP1 configured to receive transmission of the first signal and a signal pad (second pad) SxP2 configured to receive transmission of the second signal different from the first signal. As illustrated in FIG. 10, the plurality of conductor patterns formed in the wiring layer WL1 include a via land (first via land) 2LS1 that is arranged at a position overlapping with the pad SxP in plan view and electrically connected to the signal pad SxP1 through a via (first via) 2v1. Also, the plurality of conductor patterns formed in the wiring layer WL1 include a via land (second via land) 2LS2 that is arranged at a position overlapping with the signal pad SxP2 in plan view and electrically connected to the signal pad SxP2 through a via (second via) 2v2.

As illustrated in FIG. 12, the plurality of wirings 2d1 include a wiring (first wiring) 2dS1 connected to the via land 2LS1 and extending in the X direction and a wiring (second wiring) 2dS2 connected to the via land 2LS2 and extending adjacent to the wiring 2dS1 in the X direction. As illustrated in FIG. 14, a width DL2 of the via land 2LS1 is larger than a width DD1 of the wiring 2dS1 in the Y direction intersecting (orthogonal to, in FIG. 12) the X direction. Further, as illustrated in FIG. 13, the wiring 2dS2 is adjacent to the via land 2LS1 and is overlapped with the pad SxP1 in plan view.

When the wiring 2dS2 is arranged so as to overlap with the signal pad SxP1 to which a signal different from a signal to be transmitted to the wiring 2dS2 is transmitted as in the semiconductor device PKG1, even if the pitch P1 of the adjacent signal pads SxP illustrated in FIG. 9 is narrowed, the plurality of wirings 2d1 can be arranged between the adjacent via lands 2LS as illustrated in FIG. 12. Consequently, an increase in the number of wiring layers can be suppressed.

In the case of the present embodiment, the plurality of wirings 2d1 have the same width with each other. For example, the width DD1 of the wiring 2dS1 and a width DD2 of the wiring 2dS2 illustrated in FIG. 14 are the same. Although various modifications are conceivable, values of the width DD1 and the width DD2 are approximately 10 µm in the example illustrated in FIG. 14. Also, the separation distance between the plurality of conductor patterns arranged in the wiring layer WL1 (the conductor patterns 2CP and the plurality of wirings 2d1 illustrated in FIG. 12) at the smallest is the same as the width DD1 of the wirings 2d1 (for example, approximately 10 µm). Also, each of the plurality of pads 2PD illustrated in FIG. 14 has a circular shape in plan view and has a diameter (that is, the width in the X direction and the width in the Y direction) DP1 larger than the width DD1 of the wiring 2dS1 in the Y direction and the width DL2 of the via land 2LS1 in the Y direction. In the example illustrated in FIG. 14, the diameter DP1 is approximately 60 µm.

In the example illustrated in FIG. 9, when the pitch (distance between centers) P1 of the adjacent signal pads SxP is 100 µm and the diameter DP1 of the signal pads SxP is 60 µm, the separation distance between the adjacent signal pads SxP is 40 µm. Therefore, assuming that the signal pads SxP and the wirings 2d1 (see FIG. 12) do not overlap with each other, the number of the wirings 2d1 that can be arranged between the adjacent signal pads SxP is one. However, in the case of the present embodiment, the plurality of wirings 2d1 can be arranged between the adjacent signal pads SxP as illustrated in FIG. 13.

As illustrated in FIG. 14, the via land 2LS1 has a width (first width) DL1 in the X direction and the width (second width) DL2 in the Y direction in plan view. The width DL2 of the via land 2LS1 is smaller than the width DL1. In other words, the via land 2LS1 has a planar shape whose width DL2 in the X direction which is an extending direction of the plurality of wirings 2d1 is larger than the width DL1 in the Y direction. In the example illustrated in FIG. 14, the via land 2LS1 has a rectangular shape. Also, in the example illustrated in FIG. 12, each of the plurality of via lands 2LS has a rectangular shape having a longer side extending in the X direction in the same manner as the via land 2LS1. In the example illustrated in FIG. 14, the width DL1 of the via land 2LS1 is, for example, approximately 60 µm. Meanwhile, the via land 2LS1 has the width DL2 of approximately 15 µm to 30 µm.

In the case of the present embodiment, the wiring 2dS2 is disposed adjacent to the via land 2LS1 in the Y direction. Therefore, when the width DL2 of the via land 2LS1 in the Y direction is short, the separation distance between the via land 2LS1 and the wiring 2dS2 can be increased even if the wiring 2dS2 and the signal pad SxP1 are arranged so as to overlap with each other.

In addition, the width of each of the plurality of wirings 2d1 in the Y direction (for example, the width DD1 and the width DD2) is smaller than the width DL2 of the via land 2LS1 in the Y direction. Therefore, a portion where the separation distance between the signal transmission paths including the signal pad SxP1 and the signal transmission paths including the signal pad SxP2 illustrated in FIG. 2 becomes smallest is a region where the via land 2LS1 and the wirings 2d1 are adjacent to each other. When considering a crosstalk noise between the adjacent signal transmission paths, an influence of the crosstalk noise is particularly large in the region where the via land 2LS1 and the wirings 2d1 are adjacent to each other. Therefore, if a sufficient separation distance between the via land 2LS1 and the wirings 2d1 can be maintained in the region where the influence of the crosstalk noise is particularly large, deterioration of the signal quality can be reduced.

In addition to the rectangular shape illustrated in FIG. 14, the planar shape of the via land 2LS1 may include various modifications such as an oval shape. In this case, the value of the width in the X direction and the value of the width in the Y direction of the via land 2LS1 may not be constant. In the case of such a modification, the width DL2 described above may be defined as the maximum value of the width of the via land 2LS1 in the Y direction. In the same manner, the width DL1 may be defined as the maximum value of the width of the via land 2LS1 in the X direction.

As illustrated in FIG. 14, the via 2v1 has a width (third width) DV1 in the X direction and a width (fourth width) DV2 in the Y direction in plan view. The width DV2 of the via 2v1 is smaller than the width DV1. The width DL2 of the via land 2LS1 is larger than the width DV2 of the via 2v1. The width DL1 of the via land 2LS1 is larger than the width DV1 of the via 2v1. In other words, the plane area of the via 2v1 is smaller than the area of the via land 2LS1 and the via 2v1 is arranged at a position overlapping entirely with the via land 2LS1 in plan view. The via 2v1 has a planar shape whose width DV1 in the X direction which is an extending direction of the plurality of wirings 2d1 is longer than the width DV2 in the Y direction. In the example illustrated in FIG. 14, the via 2v1 has a rectangular shape. Also, in the example illustrated in FIG. 12, each of the plurality of vias 2v to be connected to the wirings 2d1 has a rectangular shape having a longer side extending in the X direction in the same manner as the via 2v1. In the example illustrated in FIG. 14, the width DV1 of the via 2v1 is, for example, approximately 40 μm. Meanwhile, the via 2v1 has the width DV2 of approximately 10 μm to 25 μm.

When the plane area of the via 2v1 is smaller than the area of the via land 2LS1 and the via 2v1 is arranged at the position overlapping entirely with the via land 2LS1 in plan view, a joint strength between the via 2v1 and the via land 2LS1 can be improved.

In addition to the rectangular shape illustrated in FIG. 14, the planar shape of the via 2v1 may include various modifications such as an oval shape. In this case, the value of the width in the X direction and the value of the width in the Y direction of the via 2v1 may not be constant. In the case of such a modification, the width DV2 described above may be defined as the maximum value of the width of the via 2v1 in the Y direction. In the same manner, the width DV1 may be defined as the maximum value of the width of the via land 2v1 in the X direction.

In addition, conceivable modifications in planar shapes of the via 2v1 and the via land 2LS1 illustrated in FIG. 14 include a case where the width DV1 in the X direction and the width DV2 in the Y direction are the same (or the width DL1 in the X direction and the width DL2 in the Y direction are the same) such as a circular shape or a square shape. However, in terms of improvement in electrical characteristics in a portion where the via 2v1 is connected to the via land 2LS1 or the signal pad SxP1, the via 2v1 preferably has a large plane area.

In the case of the present embodiment, the separation distance between the via land 2LS1 and the wiring 2dS2 is increased by shortening the width DV2 and the width DL2 in the Y direction, and the plane area of the via 2v1 is increased by increasing the width DV1 and the width DV2 in the X direction. Consequently, the electrical characteristics of a portion where the via land 2LS1 and the signal pad SxP1 are connected via the via 2v1 can be improved.

In the case of the semiconductor device PKG1, one signal pad SxP overlaps with the plurality of wirings 2d1 as illustrated in FIG. 14. As illustrated in FIG. 9, the plurality of pads 2PD include a signal pad (third pad) SxP3 configured to receive transmission of a third signal different from the first signal and the second signal described above. The plurality of conductor patterns formed in the wiring layer WL1 illustrated in FIG. 13 include a via land (third via land) 2LS3 arranged at a position overlapping with the signal pad SxP3 in plan view and electrically connected to the signal pad SxP3 through a via (third via) 2v3. The plurality of wirings 2d1 include a wiring 2dS3 connected to the via land 2LS3 and extending adjacent to the wiring 2dS1 in the X direction. As illustrated in FIG. 14, the via land 2LS1 is located between the wiring 2dS2 and the wiring 2dS3 in plan view. Further, the wiring 2dS3 overlaps with the signal pad SxP1 in plan view. In other words, the wiring 2dS2 and the wiring 2dS3 overlapping with the signal pad SxP1 are arranged adjacently on both sides of the via land 2LS1 in plan view. When one signal pad SxP overlaps with the plurality of wirings 2d1, the density of arrangement of the wirings is further increased compared with the case where one signal pad SxP overlaps with one wiring 2d1.

In the case of the semiconductor device PKG1, in the row 3PL1 located at a position closest to the outer edge side CHRs of the region CHR1 among a plurality of rows illustrated as the rows 3PL1 to 3PL8 in FIG. 12, a number of the wirings 2d1 are arranged between the two via lands 2LS adjacent to each other in the row 3PL1. For example, in the case of the semiconductor device PKG1, as illustrated in FIG. 9, the plurality of pads 2PD include a signal pad (fourth pad) SxP4 arrayed at a position adjacent to the signal pad SxP1 along the Y direction intersecting the X direction and configured to receive transmission of a fourth signal different from the first signal and the second signal described above. The plurality of conductor patterns formed in the wiring layer WL1 illustrated in FIG. 13 include a via land (fourth via land) 2LS4 arranged at a position overlapping with the signal pad SxP4 in plan view and electrically connected to the signal pad SxP4 through the via (fourth via) 2v4. The plurality of wirings 2d1 include a wiring 2dS4 connected to the via land 2LS4 and extending in the X direction. In plan view, five or more (five in FIG. 13) wirings 2d1 are arranged between the via land 2LS1 and the via land 2LS4. When the five or more wirings 2d1 are arranged between the two adjacent via lands 2LS in the row 3PL1 having the largest number of the wirings 2d1 in this manner, the plurality of signal pads SxP illustrated in FIG. 9 can be arrayed in at least six rows.

As described above, the plurality of pads 2PD of the wiring substrate SUB1 illustrated in FIG. 9 include the pads VdP configured to receive a supply of the power supply potential VDD (see FIG. 2) and the pads VsP configured to receive a supply of the reference potential VSS (see FIG. 2).

The supply paths for these fixed potentials may have a structure different from the signal transmission paths.

For example, as illustrated in FIG. 12, the plurality of conductor patterns formed in the wiring layer WL1 include a conductor pattern (reference potential conductor pattern, first conductor pattern) 2CPs1 to be electrically connected to the plurality of pads VsP (see FIG. 9) through a plurality of vias (reference potential via, first potential via) 2vs. Although only one of the plurality of vias 2vs is denoted by a reference character in FIG. 12, two circles illustrated in positions overlapped with the conductor pattern 2CPs1 are both the vias 2vs. The plurality of vias 2vs are formed at positions overlapping with the plurality of pads VsP illustrated in FIG. 9. The conductor pattern 2CPs1 is separated from the plurality of wirings 2d1. In plan view, each of the plurality of vias 2vs has a width (fifth width) DVs1 in the Y direction. In the example illustrated in FIG. 14, the planar shape of the via is a circle. The width DVs1 of the vias 2vs is larger than the width DV2 of the via 2v1 illustrated in FIG. 14. In plan view, the area of the vias 2vs is larger than the area of the via 2v1 illustrated in FIG. 14.

In the same manner, the plurality of conductor patterns formed in the wiring layer WL1 illustrated in FIG. 12 include a conductor pattern (power supply potential conductor pattern, second conductor pattern) 2CPd1 to be electrically connected to the plurality of pads VdP (see FIG. 9) through a plurality of vias (power supply potential via, second potential via) 2vd. Although only one of the plurality of vias 2vd is denoted by a reference character in FIG. 12, two circles illustrated in positions overlapped with the conductor pattern 2CPd1 are both vias 2vd. The plurality of vias 2vd are formed at positions overlapping with the plurality of pads VdP illustrated in FIG. 9. The conductor pattern 2CPd1 is separated from the plurality of wirings 2d1 and the conductor pattern 2CPs1. In plan view, each of the plurality of vias 2vd has a width (sixth width) DVd1 in the Y direction. In the example illustrated in FIG. 14, the planar shape of the vias is a circle. The width DVd1 of the vias 2vd is larger than the width DV2 of the via 2v1 illustrated in FIG. 14. In plan view, the area of the vias 2vd is larger than the area of the via 2v1 illustrated in FIG. 14.

In terms of stably supplying the power to the semiconductor chip CHP1 illustrated in FIG. 10, the power supply potential supply paths and the reference potential supply paths preferably have larger cross-sectional areas. Therefore, as illustrated in FIG. 13, the plurality of pads VsP are electrically connected to each other through the conductor pattern 2CPs1. Also, the plurality of pads VdP are electrically connected to each other through the conductor pattern 2CPd1. In this manner, since the pads 2PD adjacent to each other are electrically connected to each other in the paths for transmitting the fixed potentials, connection to thinner wirings is not necessary unlike the signal transmission paths. In terms of shortening the distance of power supply potential supply paths to the semiconductor chip CHP1, the power supply potential supply paths and the reference potential supply paths need to be formed in the region CHR1 overlapping with at least the semiconductor chip CHP1. Therefore, as illustrated in FIG. 12, the width DVs1 of the vias 2vs and the width DVd1 of the vias 2vd do not have to be as small as the width DV2 of the via 2v1 illustrated in FIG. 14. By increasing the area of the vias 2vd and the vias 2vs in plan view as illustrated in FIG. 12, the cross-sectional area of the power supply potential supply paths can be increased correspondingly.

Note that the width DVs1 of the vias 2vs and the width DVd1 of the vias 2vd illustrated in FIG. 12 are the same as a width DVs2 of vias 2vs2 and a width DVd2 of vias 2vd2 illustrated in FIG. 16 and a width DVs3 of vias 2vs3 and a width DVd3 of vias 2vd3 illustrated in FIG. 17 described later. In other words, the plane areas of the vias 2vs and the vias 2vd configured to receive a supply of the fixed potential among the plurality of vias 2v configured to electrically connect the pad forming layer PDL (see FIG. 6) and the wiring layer WL1 are the same as the plane area of the vias 2v configured to connect the wiring layers WL1 to WL3 illustrated in FIG. 6 to each other.

In addition, the supply path for the power supply potential and the supply path for the reference potential need to be arranged so as not to interfere with the arrangement of the plurality of wirings 2d1 in the wiring layer WL1 illustrated in FIG. 12. As illustrated in FIG. 12, the wiring 2dS1 is arranged on one side of the via land 2LS1 and the conductor pattern 2CPs1 and the conductor pattern 2CPd1 are arranged on the other side of the via land 2LS1 in the X direction. Specifically, each of the plurality of wirings 2d1 extends toward one side of the plurality of via lands 2LS and the conductor pattern 2CPs1 and the conductor pattern 2CPd1 are arranged on the other side of the plurality of via lands 2LS in the X direction. At least in the region CHR1 of the wiring layer WL1, the conductor pattern 2CPs1 and the conductor pattern 2CPd1 are not arranged in the extending direction of the plurality of wirings 2d1. In other words, the supply paths for the power supply potential and the supply paths for the reference potential are arranged so as not to interfere with the arrangement of the plurality of wirings 2d1 in the wiring layer WL1 illustrated in FIG. 12.

Also, as illustrated in FIG. 9, the plurality of pads VsP are arrayed along the Y direction intersecting (orthogonal to, in FIG. 9) the X direction. In this case, the conductor pattern 2CPs1 (see FIG. 12) to connect the plurality of pads VsP with each other extends along the Y direction. Accordingly, the area of the conductor pattern 2CPs1 in the wiring layer WL1 can be increased. In the same manner, the plurality of pads VdP are arrayed along the Y direction intersecting (orthogonal to, in FIG. 9) the X direction. In this case, the conductor pattern 2CPd1 (see FIG. 12) to connect the plurality of pads VdP with each other extends along the Y direction. Accordingly, the area of the conductor pattern 2CPd1 in the wiring layer WL1 can be increased.

As illustrated in FIG. 12, the via land 2LS2 is arranged in the row different from the row of the via land 2LS1 in the wiring layer WL1. In the example illustrated in FIG. 12, the via land 2LS1 is arranged in the row 3PL1, and the via land 2LS2 is arranged in the row 3PL3. Therefore, in the X direction, the via land 2LS2 is arranged between the via land 2LS1 and the conductor pattern 2CPs1 (or conductor pattern 2CPd1).

Figure 18:
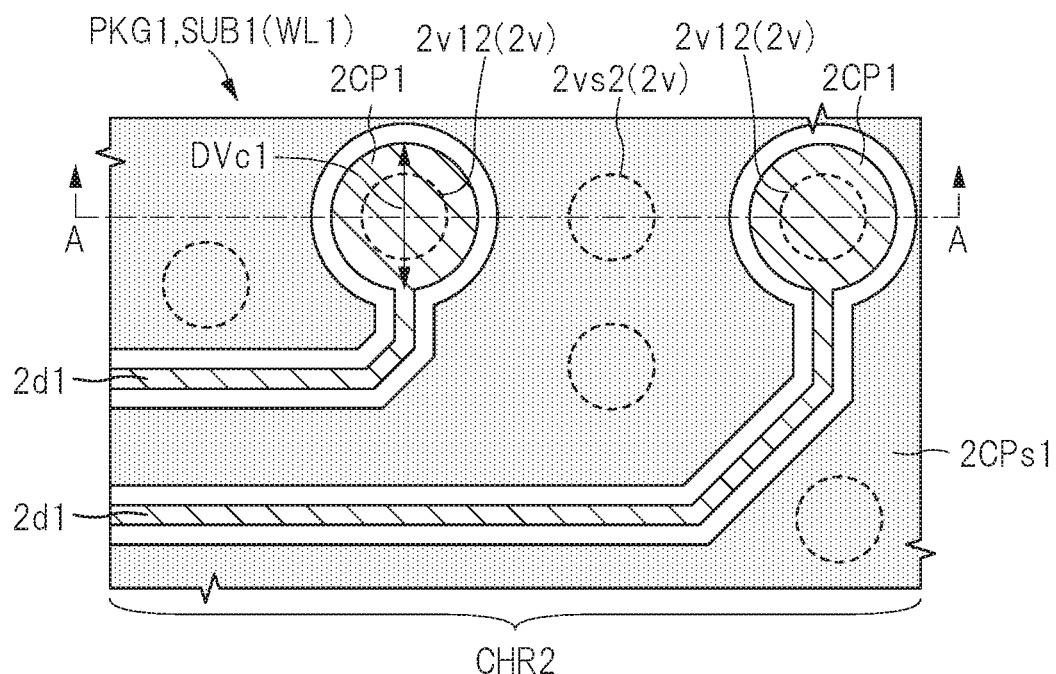
FIG. 18 is an enlarged plan view of a portion A in FIG. 5.
Figure 19:
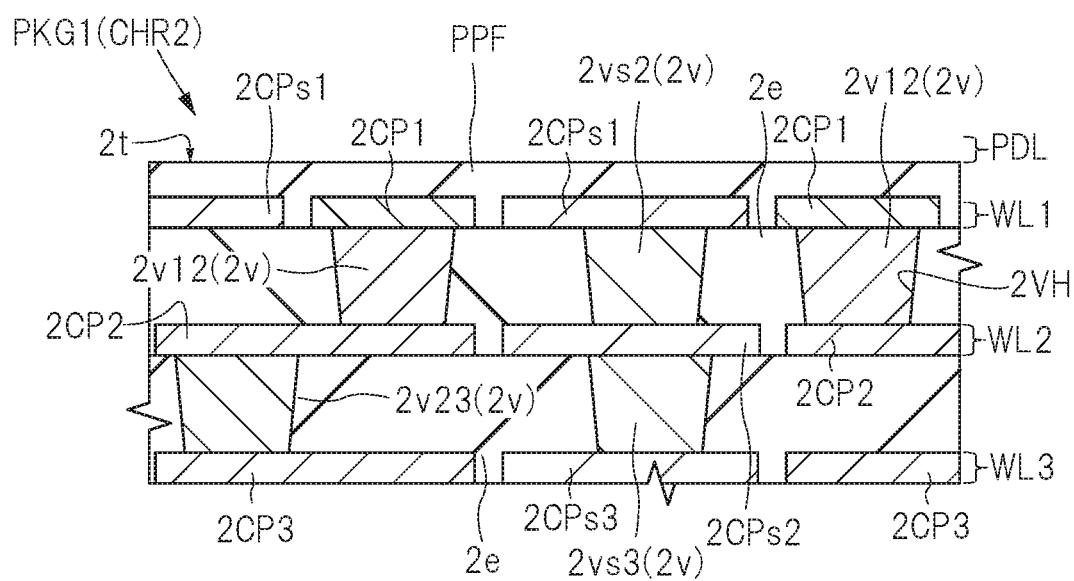
FIG. 19 is an enlarged cross-sectional view taken along a line A-A in FIG. 18.

In the case of the semiconductor device PKG1, the supply path for the reference potential is used as a shield layer for enhancing noise resistance of the signal transmission paths or as a reference path for transmitting a signal of the signal transmission paths. FIG. 16 is an enlarged plan view of the second wiring layer below the first wiring layer in FIG. 12. FIG. 17 is an enlarged plan view of a third wiring layer below the second wiring layer in FIG. 16. FIG. 18 is an enlarged plan view of a portion A in FIG. 5. FIG. 19 is an enlarged cross-sectional view taken along a line A-A in FIG. 18. In FIG. 16, the plurality of wirings 2d1 and the plurality of via lands 2LS1 in FIG. 12 are illustrated by dot lines. In FIG. 16 to FIG. 18, the vias 2v configured to electrically connect the wiring layer WL1 and the wiring layer WL2 illustrated in FIG. 6 are illustrated by dot lines.

Figure 16:
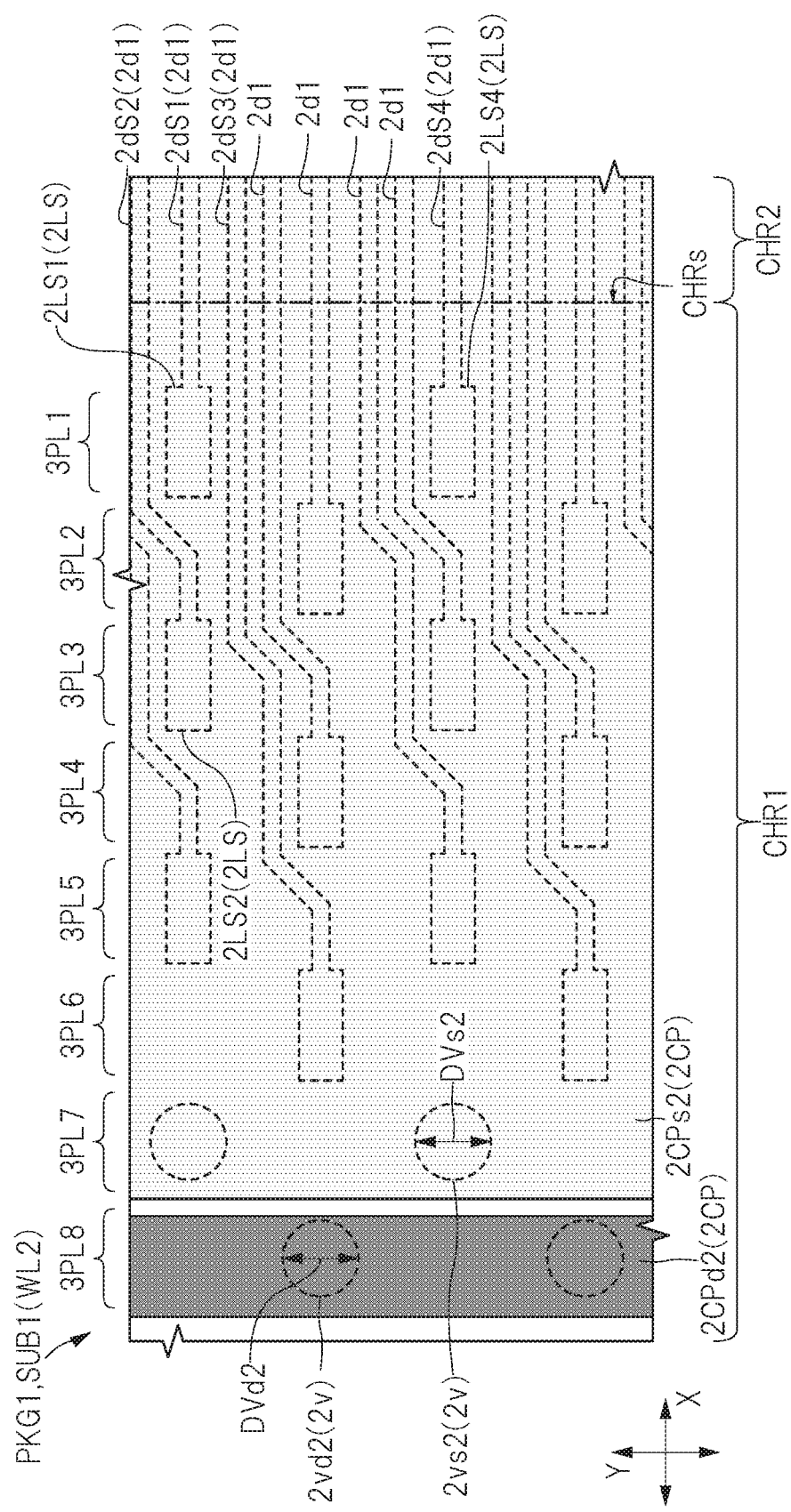
FIG. 16 is an enlarged plan view of the second wiring layer below a first wiring layer in FIG. 12.

As illustrated in FIG. 16, the wiring substrate SUB1 includes the wiring layer WL2 located at a position closest to the wiring layer WL1 (see FIG. 12) among the plurality of wiring layers. The wiring layer WL2 includes a conductor pattern (second conductor pattern) 2CPs2 electrically connected to the conductor pattern 2CPs1 (see FIG. 12) and having an area larger than a portion of the conductor pattern 2CPs1 in the region CHR1. In the region CHR1 and the region CHR2, each of the plurality of wirings 2d1 overlaps with the conductor pattern 2CPs2 of the wiring layer WL2. The conductor pattern 2CPs2 is a large area conductor pattern (also referred to as "conductor plane"). The conductor pattern having the large area configured to receive a supply of reference potential like the conductor pattern 2CPs2 may be referred to as "ground plane". Also, the conductor pattern having the large area configured to receive a supply of power supply potential like a conductor pattern 2CPd3 illustrated in FIG. 17 may be referred to as "power supply plane".

The conductor pattern 2CPs2 is connected to the conductor pattern 2CPs1 illustrated in FIG. 12 through the plurality of vias 2vs2. As illustrated in FIG. 15, the via 2vs2 is arranged at a position overlapping with the via 2vs configured to electrically connect the pad VsP of the pad forming layer PDL and the conductor pattern 2CPs1 of the wiring layer WL1. As is understood by comparing FIG. 12 and FIG. 16, the conductor pattern 2CPs1 and the conductor pattern 2CPs2 overlap with each other, and an area where the conductor pattern 2CPs1 and the conductor pattern 2CPs2 overlap is twice or more of the plane area of the vias 2vs and the vias 2vs2. Therefore, as a modification of FIG. 15, a configuration in which the vias 2vs2 are arranged at positions not overlapping with the vias 2vs is also conceivable. In addition, as described above, the width DVs2 of the vias 2vs2 in the Y direction illustrated in FIG. 16 and the width DVs1 of the vias 2vs in the Y direction illustrated in FIG. 12 are the same.

In the example illustrated in FIG. 16, the plurality of via lands 2LS and the plurality of wirings 2d1 overlap with the conductor pattern 2CPs2 which is a ground plane. The structure in which the large area conductor pattern 2CPs2 is arranged so as to overlap with the wirings 2d1 configured to transmit a signal in the thickness direction in this manner is referred to as "microstrip line structure". In the microstrip line structure, an electromagnetic wave generated by a signal flowing in the wirings 2d1 is shielded by the conductor pattern 2CPs2, and thus scattering of the electromagnetic wave to the periphery can be suppressed. Note that the fixed potential (preferably, the ground potential) is preferably supplied to the conductor pattern 2CPs2 that functions as a shield against the electromagnetic wave. In the case of the present embodiment, the conductor pattern 2CPs2, which is a ground plane configured to receive a supply of the reference potential, is provided in the wiring layer WL2 at a position overlapping with the plurality of wirings 2d1. As a modification, a power supply plane configured to receive a supply of power supply potential may be provided in the wiring layer WL2 at a position overlapping with the plurality of wirings 2d1 as in, for example, the conductor pattern 2CPd3 illustrated in FIG. 17.

As illustrated in FIG. 16, the wiring layer WL2 includes a conductor pattern 2CPd2 to be electrically connected with the conductor pattern 2CPd1 (see FIG. 12). The conductor pattern 2CPd2 is arranged so as to be separated from the conductor pattern 2CPs2. The conductor pattern 2CPd2 is connected to the conductor pattern 2CPd1 illustrated in FIG. 12 through the plurality of vias 2vd2. As illustrated in FIG. 15, the via 2vd2 is arranged at a position overlapping with the via 2vd configured to electrically connect the pad VdP of the pad forming layer PDL and the conductor pattern 2CPd1 of the wiring layer WL1. As is understood by comparing FIG. 12 and FIG. 16, the conductor pattern 2CPd1 and the conductor pattern 2CPd2 overlap with each other, and an area where the conductor pattern 2CPd1 and the conductor pattern 2CPd2 overlap with each other is twice or more the plane area of the vias 2vd and the vias 2vd2. Therefore, as a modification of FIG. 15, a configuration in which the vias 2vd2 are arranged at positions not overlapping with the vias 2vd is also conceivable. In addition, as described above, the width DVd2 of the vias 2vd2 in the Y direction illustrated in FIG. 16 and the width DVd1 of the vias 2vd in the Y direction illustrated in FIG. 12 are the same.

Figure 17:
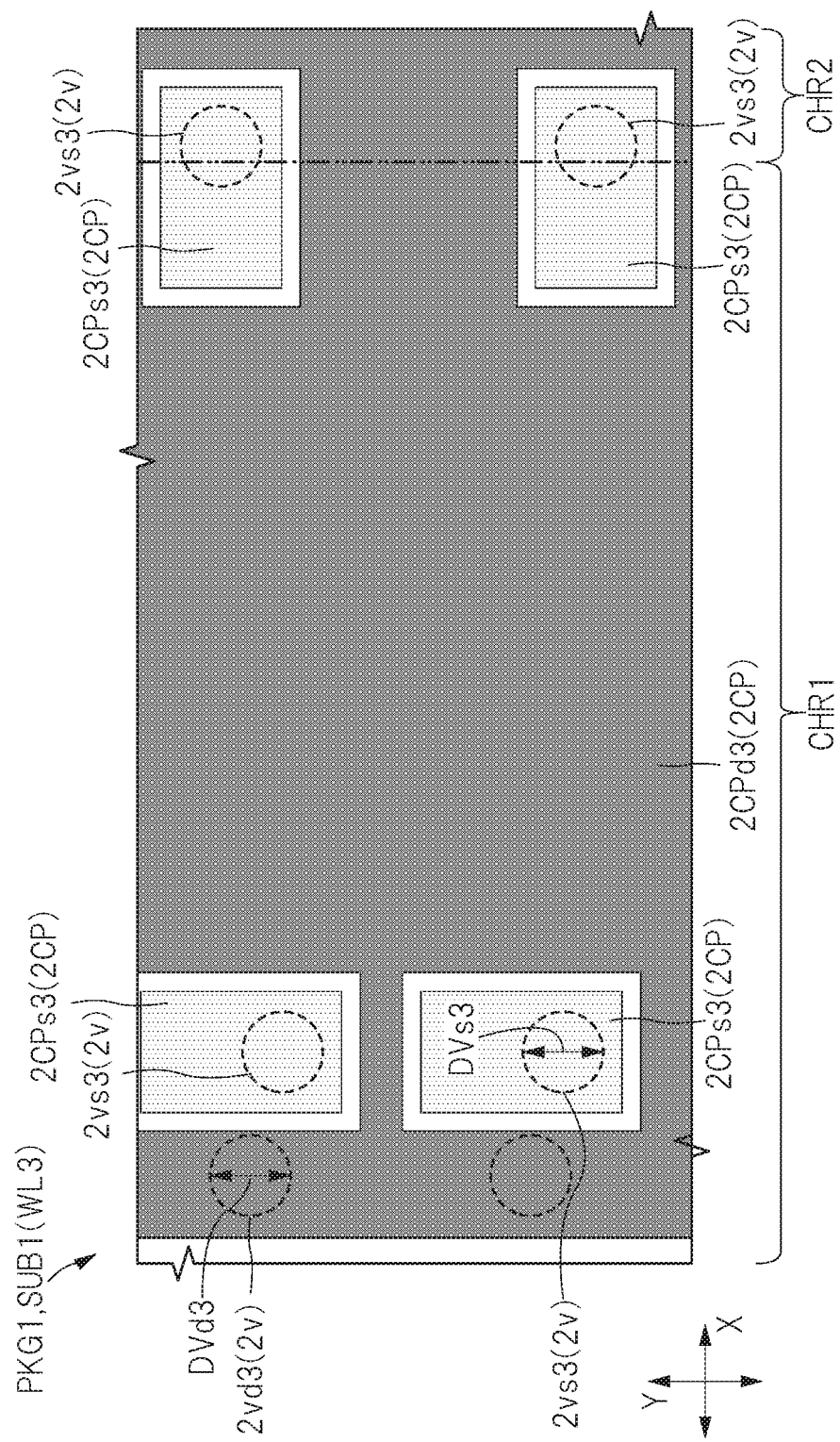
FIG. 17 is an enlarged plan view of a third wiring layer below the second wiring layer in FIG. 16.

As illustrated in FIG. 17, the wiring substrate SUM includes the wiring layer WL3 located below the wiring layer WL2 (see FIG. 16) among the plurality of wiring layers. The wiring layer WL3 includes a conductor pattern 2CPd3 electrically connected to the conductor pattern 2CPd2 (see FIG. 16) and having an area larger than the conductor pattern 2CPd2. The conductor pattern 2CPd3 is a large area power supply plane as described above. In order to stabilize the power to be supplied to the semiconductor chip CHP1 (see FIG. 6), the ground plane and the power supply plane are preferably arranged in the vicinity of the semiconductor chip CHP1. In the case of the present embodiment, the conductor pattern 2CPs2 and the conductor pattern 2CPd3 are arranged between the insulating layer 2CR (see FIG. 6) serving as the core insulating layer and the semiconductor chip CHP1. Therefore, the power to be supplied to the semiconductor chip CHP1 can be stabilized. Note that the wiring layer WL3 where the conductor pattern 2CPd3 is arranged and the wiring layer WL4 connected to the through-hole wirings 2THW (see FIG. 6) illustrated in FIG. 6 are different layers from each other in the case of the semiconductor device PKG1. However, as a modification of FIG. 6, the wiring layer WL3 may be connected to the through-hole wirings 2THW. In this case, compared with the example illustrated in FIG. 6, the number of wiring layers can further be reduced. For example, it is sufficient if five wiring layers are provided in addition to the pad forming layer PDL and the land forming layer LDL.

The conductor pattern 2CPd3 is connected to the conductor pattern 2CPd2 illustrated in FIG. 16 through the plurality of vias 2vd3. As is understood by comparing FIG. 16 and FIG. 17, the conductor pattern 2CPd2 and the conductor pattern 2CPd3 overlap with each other, and an area where the conductor pattern 2CPd2 and the conductor pattern 2CPd3 overlap with each other is twice or more of the plane area of the vias 2vd2 and the vias 2vd3. Therefore, the vias 2vd3 are arranged at positions not overlapping with the vias 2vd2. When a sufficient space is available for forming the vias 2v, processing is easier when the vias 2v that connect the respective wiring layers do not overlap with each other in the thickness direction. However, as a modification, the vias 2vd3 may overlap with the vias 2vd2. In terms of minimization of the supply paths of the power supply potential, the vias 2v configured to connect the respective wiring layers preferably overlap with each other in the thickness direction. In addition, as described above, the width DVd3 of the vias 2vd3 in the Y direction illustrated in FIG. 17 and the width DVd1 of the vias 2vd in the Y direction illustrated in FIG. 12 are the same.

As illustrated in FIG. 17, the wiring layer WL3 includes a plurality of conductor patterns 2CPs3 to be electrically connected with the conductor pattern 2CPs2 (see FIG. 16). The plurality of conductor patterns 2CPs3 are each arranged so as to be separated from the conductor pattern 2CPd3. Since the wiring layer WL3 is a wiring layer in which the power supply plane is provided, the conductor patterns 2CPs3 configured to receive a supply of the reference potential are selectively formed at positions where the vias 2vs3 are arranged. Also, the area of the plurality of conductor patterns 2CPs3 is smaller than the area of the conductor pattern 2CPs1 of the wiring layer WL1 illustrated in FIG. 12. The plurality of conductor patterns 2CPs3 are connected to the conductor pattern 2CPs2 illustrated in FIG. 16 through the plurality of vias 2vs3. In the example illustrated in FIG. 15, the via 2vs3 does not overlap with the via 2vs2. However, as a modification, the via 2vs3 may overlap with the via 2vs2. In addition, as described above, the width DVs3 of the vias 2vs3 in the Y direction illustrated in FIG. 17 and the width DVs1 of the vias 2vs in the Y direction illustrated in FIG. 12 are the same.

In terms of reduction of the crosstalk noise between the adjacent signal transmission paths, the fixed potential (preferably the ground potential) is preferably supplied to the periphery of the signal transmission paths in plan view. As illustrated in FIG. 12, a number of the wirings 2d1 are arranged at high density in the region CHR1, and it is thus difficult to arrange the conductor pattern 2CPs1 between the adjacent wirings 2d1. However, in the region (the region CHR2 illustrated in FIG. 18) away from the semiconductor chip CHP1 (see FIG. 5) in plan view, the conductor pattern 2CPs1 can be arranged between the adjacent wirings 2d1 as illustrated in FIG. 18. In other words, the conductor pattern 2CPs1 configured to receive a supply of the reference potential is present both in the region CHR1 (see FIG. 12) and in the region CHR2 in the wiring layer WL1. In the region CHR2, the conductor pattern 2CPs1 separated from the wirings 2d1 is arranged between the plurality of wirings 2d1. In this case, the electromagnetic waves generated when signal currents flow respectively in the plurality of wirings 2d1 are shielded by the conductor pattern 2CPs1. Consequently, the electromagnetic waves are suppressed from spreading, and thus the crosstalk noise can be reduced.

In addition, one end of each of the plurality of wirings 2d1 is connected to the via land 2LS illustrated in FIG. 12, and the other end thereof is connected to the conductor pattern 2CP1. As illustrated in FIG. 19, the conductor patterns 2CP1 are connected to vias (signal vias) 2v12 configured to connect the wiring layer WL1 and the wiring layer WL2. In the example illustrated in FIG. 18, the planar shape of the vias 2v12 is a circle and the plane area of the vias 2v12 is the same as the plane area of the vias 2vs1 illustrated in FIG. 12. In the example illustrated in FIG. 18, the planar shape of the conductor patterns 2CP1 is a circle having a diameter larger than the diameter of the vias 2v12. The width of the conductor patterns 2CP1 in the Y direction, that is, the diameter DVc1 is larger than the width DV2 of the via land 2LS1 illustrated in FIG. 14.

In the case of the semiconductor device PKG1, each of the plurality of via lands 2LS constituting the signal transmission paths among the conductor patterns formed in the first wiring layer illustrated in FIG. 12 is led out to the region CHR2 through the wiring 2d1, and no vias 2v12 configured to connect the wiring layer WL1 and the wiring layer WL2 is formed immediately below the via land 2LS. In other words, the plurality of pads 2PD arranged in the pad forming layer PDL illustrated in FIG. 9 include the plurality of signal pads SxP configured to receive transmission of signals. The plurality of conductor patterns formed in the wiring layer WL1 illustrated in FIG. 12 include a plurality of via lands (signal via lands) 2LS arranged at positions overlapping with the plurality of signal pads SxP and electrically connected to the plurality of signal pads SxP. The plurality of via lands 2LS are connected respectively to the plurality of vias 2v12 (see FIG. 19) configured to electrically connect the wiring layer WL1 and the wiring layer WL2 (see FIG. 19) through the plurality of wirings 2d1. The plurality of via lands 2LS do not overlap with the plurality of vias 2v12.

As illustrated in FIG. 9, the plurality of pads 2PD provided in the semiconductor device PKG1 of the present embodiment are arranged such that intervals of the adjacent pads 2PD are small. Also, the plurality of signal pads SxP are arrayed in many rows (six rows in FIG. 9). Further, each of the plurality of signal transmission paths is led out from the region CHR1 to the region CHR2 in the wiring layer WL1 illustrated in FIG. 12, and is not lead out in the other wiring layers. Therefore, the number of wiring layers can be reduced.

In FIG. 19, the via 2v12 configured to electrically connect the conductor pattern 2CP1 of the wiring layer WL1 and a conductor pattern 2CP2 of the wiring layer WL2 and a via 2v23 configured to electrically connect the conductor pattern 2CP2 of the wiring layer WL2 and a conductor pattern 2CP3 of the wiring layer WL3 are illustrated as the signal transmission paths. Also, in FIG. 15 and FIG. 19, the via 2vs2 configured to electrically connect the conductor pattern 2CPs1 of the wiring layer WL1 and a conductor pattern 2CPs2 of the wiring layer WL2 and the via 2vs3 configured to electrically connect the conductor pattern 2CPs2 of the wiring layer WL2 and the conductor pattern 2CPs3 of the wiring layer WL3, which are supply paths of reference potential, are illustrated. Further, in FIG. 15 or FIG. 17, the via 2vd2 configured to electrically connect the conductor pattern 2CPd1 of the wiring layer WL1 and the conductor pattern 2CPd2 of the wiring layer WL2 and the via 2vd3 (see FIG. 17) configured to electrically connect the conductor pattern 2CPd2 of the wiring layer WL2 and the conductor pattern 2CPd3 of the wiring layer WL3, which are supply paths of power supply potential, are illustrated. The structure of layers below the wiring layer WL3 illustrated in FIG. 6 is the same as the structure of electrically connecting the wiring layer WL2 and the wiring layer WL3, and thus illustration thereof is omitted. However the wiring layer WL4 and the wiring layer WL5 are connected through the through-hole wirings 2THW. In addition, in each of the wiring layer WL6 and the wiring layer WL7 illustrated in FIG. 6, a large area conductor pattern 2CP which is either the ground plane or the power supply plane is formed.

The plurality of signal pads SxP illustrated in FIG. 9 are connected respectively to the plurality of solder balls SB illustrated in FIG. 4 through the plurality of signal transmission paths separated from each other. Also, the plurality of pads VsP illustrated in FIG. 9 are connected respectively to the plurality of solder balls SB illustrated in FIG. 4 through the conductor patterns 2CP formed in the wiring layers WL1 to WL7 illustrated in FIG. 6. Further, the plurality of pads VdP illustrated in FIG. 9 are connected respectively to the plurality of solder balls SB illustrated in FIG. 4 through the conductor patterns 2CP formed in the wiring layers WL1 to WL7 illustrated in FIG. 6.

In the case of the semiconductor device PKG1, each of the plurality of wirings 2d1 is led out from the region overlapping with the semiconductor chip CHP1 to a region in the periphery of the wiring substrate SUB1, in the wiring layer WL1 illustrated in FIG. 6. Therefore, the vias 2v configured to connect the wiring layers WL1 to WL7 and the vias 2v configured to connect the wiring layer WL7 and the land forming layer LDL are both formed by the build-up method. On the other hand, since a number of conductor patterns are arranged at a high density in the region CHR1 of the wiring layer WL1 illustrated in FIG. 12, it is difficult to form the vias 2v by the build-up method.

As illustrated in FIG. 19, for example, the vias 2v formed by the build-up method are formed as follows. That is, after an insulating film 2e that covers the wiring layer WL1 is stacked, the insulating film 2e is irradiated with a laser beam to form through holes 2VH. Then, a conductor film is formed in the through holes 2VH to form the vias 2v. The vias 2v formed by a processing method using a laser beam are referred to as "laser vias". The laser vias allows microfabrication compared with vias formed mechanically by using a jig such as a drill. However, since the vias 2v formed on the via lands 2LS illustrated in FIGS. 12 to 14 have small planar size and small processing margin, it is difficult to form the vias 2v by the processing method using a laser beam.

Accordingly, the vias 2v formed on the via lands 2LS illustrated in FIGS. 12 to 14 are formed by using a photolithography technique. A method of forming the via 2v1 and the via 2v2 illustrated in FIG. 10 will be described as an example below. The vias 2v formed by using the photolithography technique are referred to as "photo vias". FIGS. 20 to 23 are enlarged cross-sectional views illustrating the process of forming the vias on the via lands in the first wiring layer in FIG. 10.

The method of manufacturing the semiconductor device PKG1 of the present embodiment includes a step of preparing the wiring substrate SUB1 illustrated in FIG. 6 and a step of mounting the semiconductor chip CHP1 on the wiring substrate SUB1 by a flip-chip interconnection.

First, the wiring layers WL1 to WL7 and the land forming layer LDL illustrated in FIG. 6 are formed respectively by the build-up method. In the build-up method, the insulating layer 2CR, which is a core insulating layer having the plurality of through-hole wirings 2THW formed therein, is used as a base member, and the insulating films 2e and conductor patterns constituting the wiring layers are stacked in sequence on the upper layer and the lower layer of the base material. The vias 2v configured to connect the wiring layers are formed by irradiating with a laser beam as described above. The conductor patterns and the vias 2v formed respectively in the wiring layers WL1 to WL7 and the land forming layer LDL are, for example, a metal material containing copper as a main component.

As illustrated in FIG. 12, the via land 2LS1 configured to receive transmission of the first signal, the wiring 2dS1 connected to the via land 2LS1 and extending in the X direction, the via land 2LS2 configured to receive transmission of the second signal different from the first signal, and the wiring 2dS2 connected to the via land 2LS2 and extending adjacent to the wiring 2dS1 in the X direction are formed in the wiring layer WL1.

Next, the insulating film PPF is formed to cover the plurality of conductor patterns including the plurality of wirings 2d1 (see FIG. 20) and the plurality of via lands 2LS (see FIG. 20) formed in the wiring layer WL1. The insulating film PPF is made of a photosensitive resin having photosensitivity to light PHL illustrated in FIG. 20.

Figure 20:
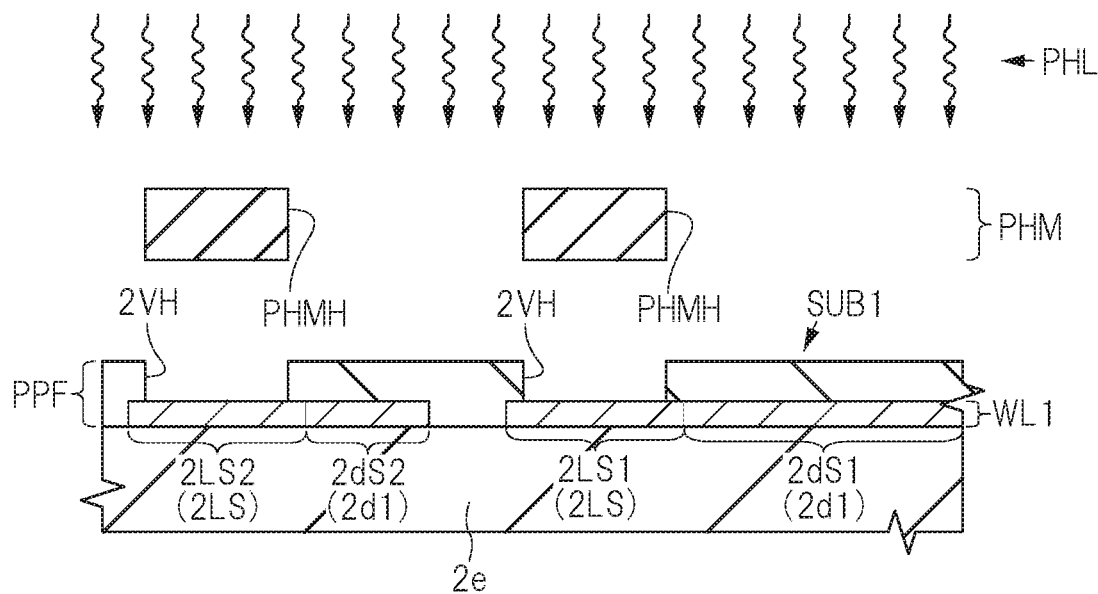
FIG. 20 is an enlarged cross-sectional view illustrating a step of forming the vias on the via lands in the first wiring layer in FIG. 10.

Next, as illustrated in FIG. 20, the insulating film PPF is irradiated with the light PHL via a photomask (reticle) PHM (exposing step). A plurality of openings PHMH are patterned in the photomask PHM. The insulating film PPF has photosensitivity to the light PHL. The insulating film PPF of the present embodiment has, for example, negative-type characteristics. Therefore, in the insulating film PPF, a portion of the material of the insulating film PPF not exposed to the light PHL is removed by development, and the plurality of through holes 2VH are formed in the insulating film PPF. The plurality of through holes 2VH are formed on the plurality of via lands 2LS, respectively. Also, the via lands 2LS are exposed from the insulating film PPF at bottoms of the through holes 2VH. This step may be performed in a state in which the positional relationship between the photomask PHM and the wiring substrate SUB1 is fixed. Alternatively, a stepper configured to move the photomask PHM and the wiring substrate SUB1 while shifting the relative positional relationship therebetween intermittently may be used. In the description above, an exposure system performed through the photomask has been described as an example. However, a direct exposure system in which the pattern is directly drawn by selectively irradiating with the light PHL may also be applied.

Figure 21:
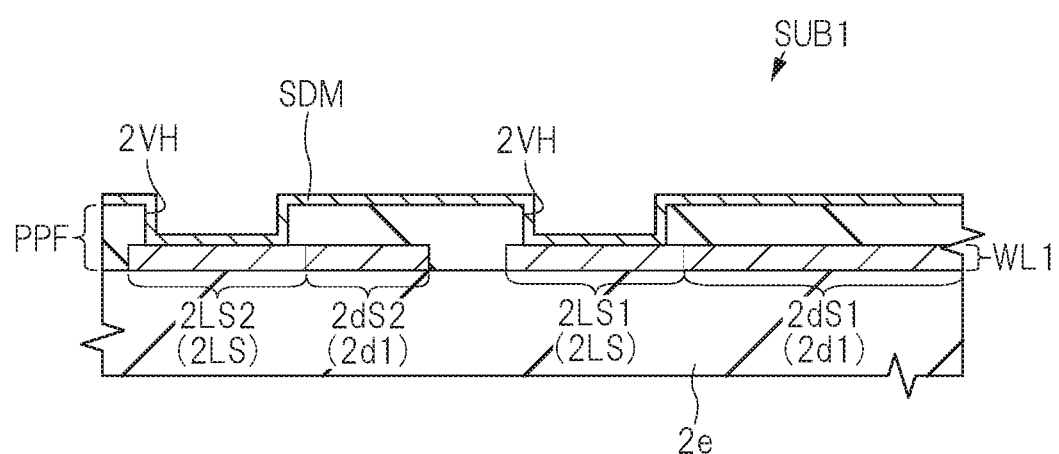
FIG. 21 is an enlarged cross-sectional view illustrating the step of forming the vias on the via lands in the first wiring layer in FIG. 10.

Next, as illustrated in FIG. 21, a seed metal film SDM is formed on the insulating film PPF and on the via lands 2LS exposed at the bottom of the through holes 2VH formed in the insulating film PPF. The seed metal film SDM is, for example, a metal film containing copper as a main component. The seed metal film SDM is formed by, for example, an electroless plating process or a sputtering. In this case, the film made of titanium (Ti) may be used as an adhesion layer or a barrier metal.

Figure 22:
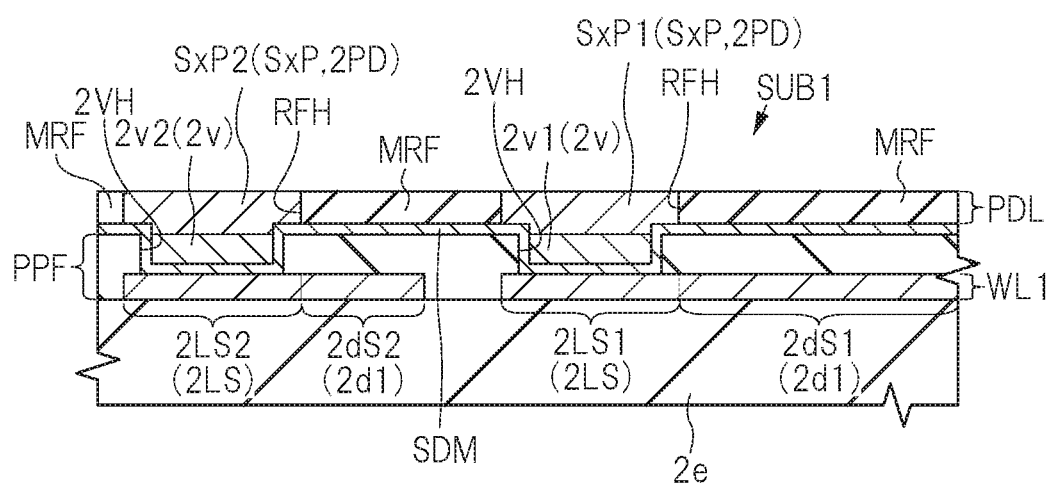
FIG. 22 is an enlarged cross-sectional view illustrating the step of forming the vias on the via lands in the first wiring layer in FIG. 10.

Next, as illustrated in FIG. 22, a plating mask MRF is formed so as to cover the seed metal film SDM, a plurality of openings RFH are formed in the plating mask MRF, and then the vias 2v1 and the pads 2PD are formed in the openings RFH. The plating mask MRF has photosensitivity to light having a wavelength band of an ultraviolet ray or the like. Also, in the plating mask MRF, the plurality of openings RFH are formed at positions where the vias 2v and the pads 2PD are to be formed. The openings RFH are formed by, for example, irradiating the plating mask MRF selectively with light such as an ultraviolet ray. The vias 2v and the pads 2PD are formed at once by, for example, an electrolytic plating method. Accordingly, the via 2v1 and the via 2v2 exposing from the insulating film PPF are formed on the via lands 2LS. In addition, the pad SxP1 is formed on the via 2v1 and the pad SxP2 is formed on the via 2v2. In plan view, the opening area of the openings PHF is larger than the opening area of the through holes 2VH. Therefore, the vias 2v and the pads 2PD can be formed at once by the electrolytic plating method. Since the vias 2v and the pads 2PD are formed integrally, boundaries between the vias 2v and the pads 2PD are less likely to be broken compared with the case where the vias 2v and the pads 2PD are formed separately.

Figure 23:
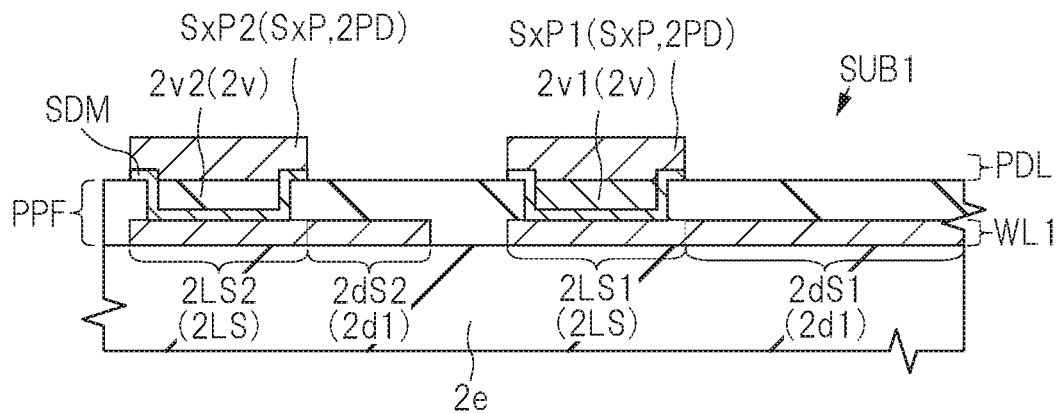
FIG. 23 is an enlarged cross-sectional view illustrating the step of forming the vias on the via lands in the first wiring layer in FIG. 10.

Next, as illustrated in FIG. 23, the plating mask MRF and a portion of the seed metal film SDM located under the plating mask MRF illustrated in FIG. 22 are removed. Accordingly, the via 2v1 and the via 2v2 formed on the via lands 2LS are electrically separated from each other. Also, the pad SxP1 formed on the via 2v1 and the pad SxP2 formed on the via 2v2 are electrically separated from each other.

Although not illustrated in FIG. 22, after a metal film that constitutes the pads 2PD is formed, a metal film (illustration is omitted) made of a metal material other than copper may further be formed on the pads 2PD in order to improve connectivity between the pads 2PD and the solder material. Examples of the metal film that improves the connectivity between the pads 2PD and the solder material include a tin (Sn) plated film and a stacked film including nickel (Ni), palladium (Pd), and gold (Au). Alternatively, the solder material may be applied onto the pads 2PD after part of the seed metal film SDM is removed.

Note that the vias 2v and the pads 2PD formed by the electrolytic plating method as described above have the seed metal film SDM under the metal patterns. However, the seed metal film SDM illustrated in FIG. 23 is omitted in FIG. 10 and FIG. 11.

As described above, when the vias 2v are formed by using the photolithography technique, resolution can be enhanced by reducing the thickness of the insulating film PPF. For example, in the case of the present embodiment, as illustrated in FIG. 10, the wiring substrate SUB1 includes the insulating film 2e between the wiring layer WL1 and the wiring layer WL2, and the thickness of the insulating film PPF is smaller than the thickness of the insulating film 2e between the wiring layer WL1 and the wiring layer WL2. In this manner, by reducing the thickness of the insulating film PPF, the plurality of vias 2v to be connected to the signal pads SxP can be formed at a high degree of accuracy.

Also, in the case of the semiconductor device PKG1, the signal pad SxP overlaps with other wirings 2d1 as described with reference to FIG. 14. Therefore, a parasitic capacitance is preferably reduced in the region where the signal pad SxP and the wirings 2d1 overlap. The capacitance between the conductors facing each other is inversely proportional to the distance between the conductors. Therefore, by reducing the thickness of the insulating film PPF, the parasitic capacitance can be reduced in the region where the signal pad SxP and the wirings 2d1 overlap.

When signal transmission is performed at a high speed, an influence of the parasitic capacitance in the vicinity of input/output terminals of the semiconductor chip CHP1 illustrated in FIG. 10 on the stability of the high-speed operation is large compared with the signal transmission at a low speed. Therefore, in terms of reduction of parasitic capacitance in the vicinity of the input/output terminals of the semiconductor chip CHP1, smaller plane area is preferable for the pads 2PD including the plurality of signal pads SxP. As illustrated in FIG. 11, each of side surfaces 2PDs of the plurality of pads 2PD comes into contact with an underfill resin or each of the projecting electrodes 3BP. In the example illustrated in FIG. 11, each of the side surfaces 2PDs of the plurality of pads 2PD comes into contact with both the underfill resin UF and each of the projecting electrodes 3BP. In other words, in the region CHR1 of the pad forming layer PDL, an upper surface of the insulating film PPF is not covered with an insulating film such as the solder resist film.

Figure 24:
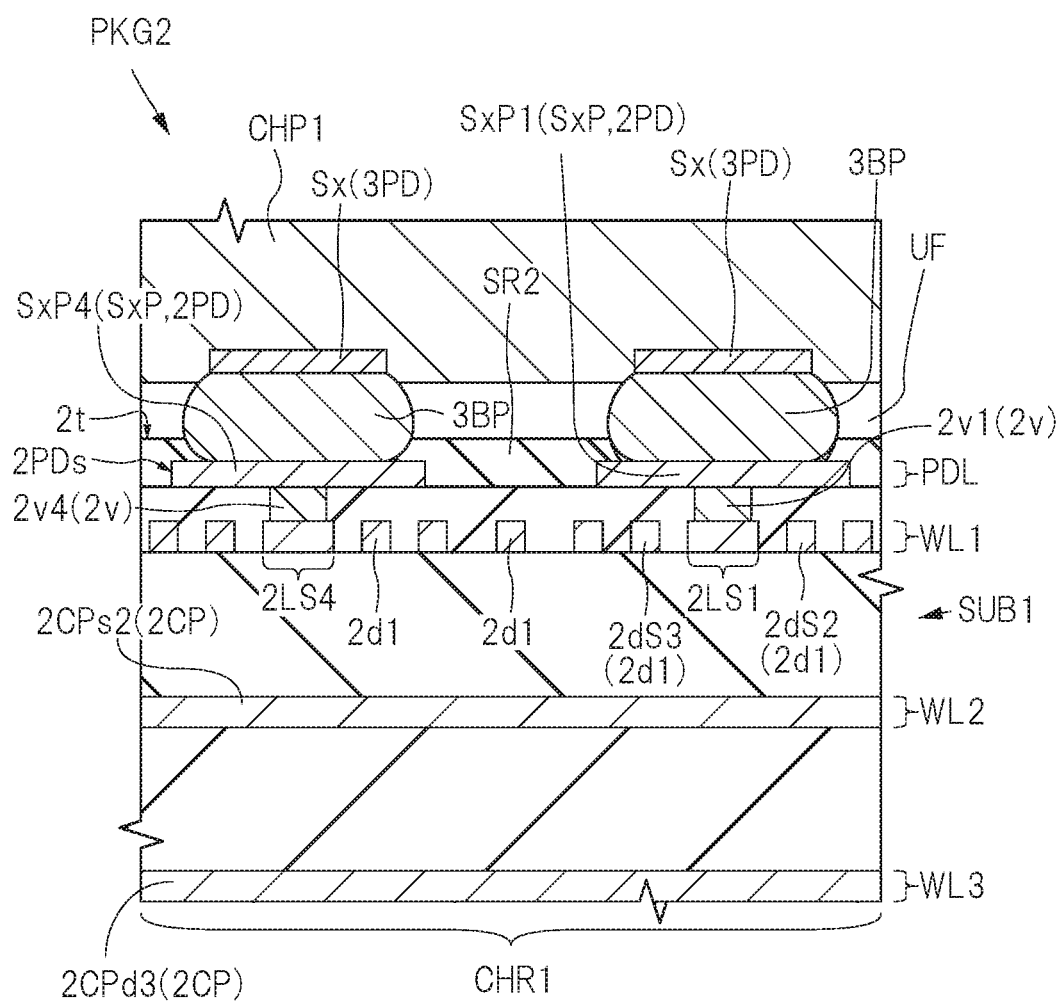
FIG. 24 is an enlarged cross-sectional view illustrating a semiconductor device according to a modification with respect to the semiconductor device in FIG. 11.

FIG. 24 is an enlarged cross-sectional view illustrating a semiconductor device according to a modification with respect to the semiconductor device in FIG. 11. When the plurality of pads 2PD are covered with an insulating film SR2 made of a solder resist film like the semiconductor device PKG2 illustrated in FIG. 24, part of the pads 2PD is exposed from the insulating film SR2 through openings formed in the insulating film SR2. In this case, the side surfaces 2PDs of the pads 2PD are covered with the insulating film SR2, and hence do not come into contact with the underfill resin UF and the projecting electrodes 3BP. In the case of the semiconductor device PKG2, the insulating film SR2 made of a solder resist film is interposed between the adjacent pads 2PD. In this case, a solder component contained in the projecting electrodes 3BP, which are conductive members configured to electrically connect the pads 2PD and the electrodes 3PD, is less likely to be spread out to the periphery. Therefore, the short circuit of the pads 2PD adjacent to each other via the solder can be suppressed.

However, although exposed area of the pads 2PD of the semiconductor device PKG2 is smaller than the semiconductor device PKG1 illustrated in FIG. 11, reduction of the contact area between the pads 2PD and the projecting electrodes 3BP is difficult in terms of securing the joint strength between the pads 2PD and the projecting electrodes 3BP. Therefore, the diameter of the pads 2PD of the semiconductor device PKG2 in plan view is larger than the diameter of the pads 2PD of the semiconductor device PKG1 in plan view. For example, in the example illustrated in FIG. 24, the diameter of the pads 2PD is approximately 80 μm. In other words, in terms of reduction of the area of the pads 2PD, the semiconductor device PKG1 is more preferable than the semiconductor device PKG2 illustrated in FIG. 24. Also, in the case of the semiconductor device PKG1 illustrated in FIG. 11, the plane area of the pads 2PD can be reduced as described above. Therefore, even when the solder resist film is not interposed between the adjacent pads 2PD, the short circuit of the adjacent pads 2PD via the solder can be suppressed.

Although some modifications have been described in the embodiment above, representative modifications other than the modifications described in the embodiment above will be described below.

<Modification 1>

Figure 25:
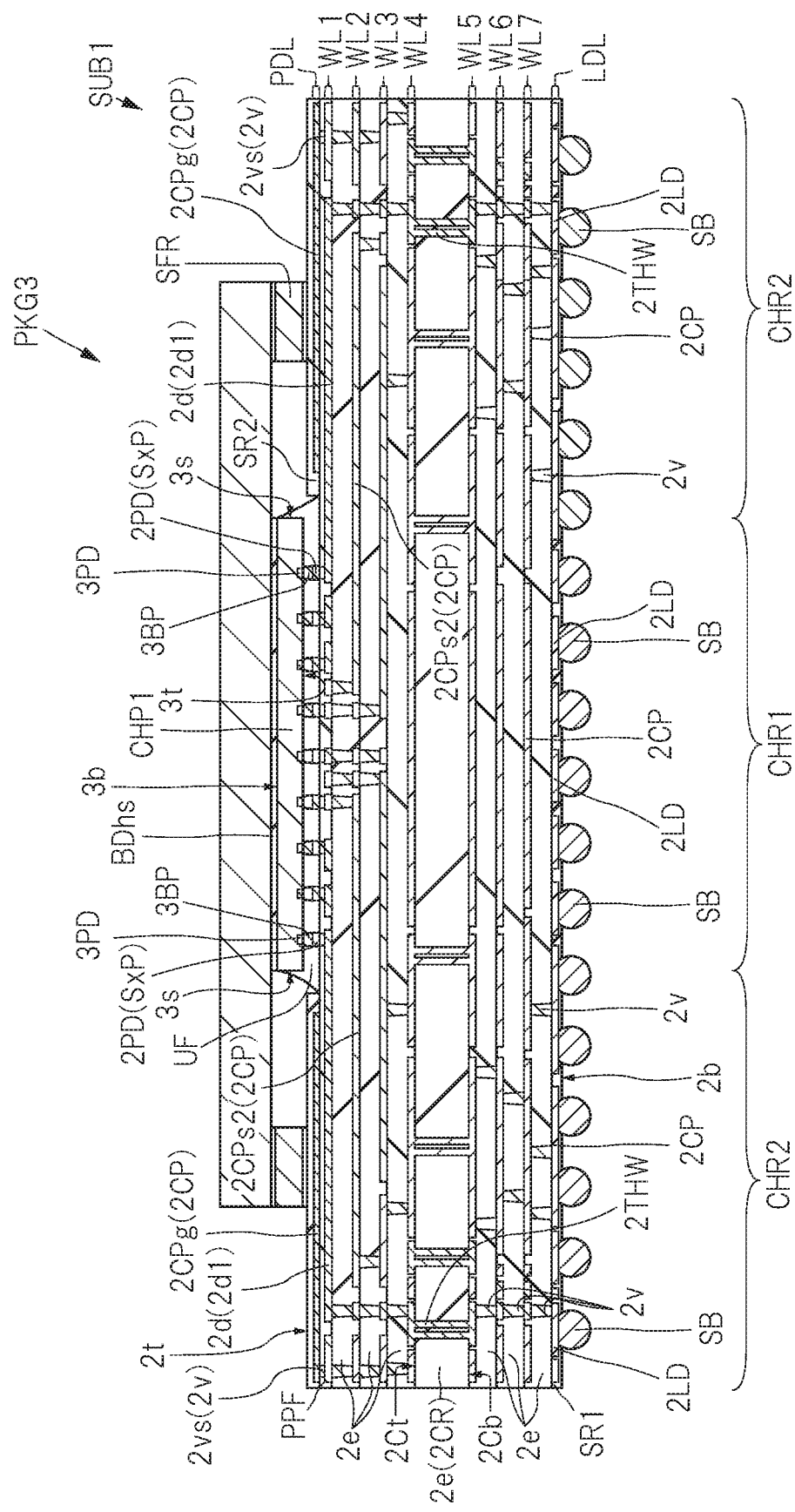
FIG. 25 is a cross-sectional view illustrating a semiconductor device according to a modification with respect to the semiconductor device in FIG. 6.
Figure 26:
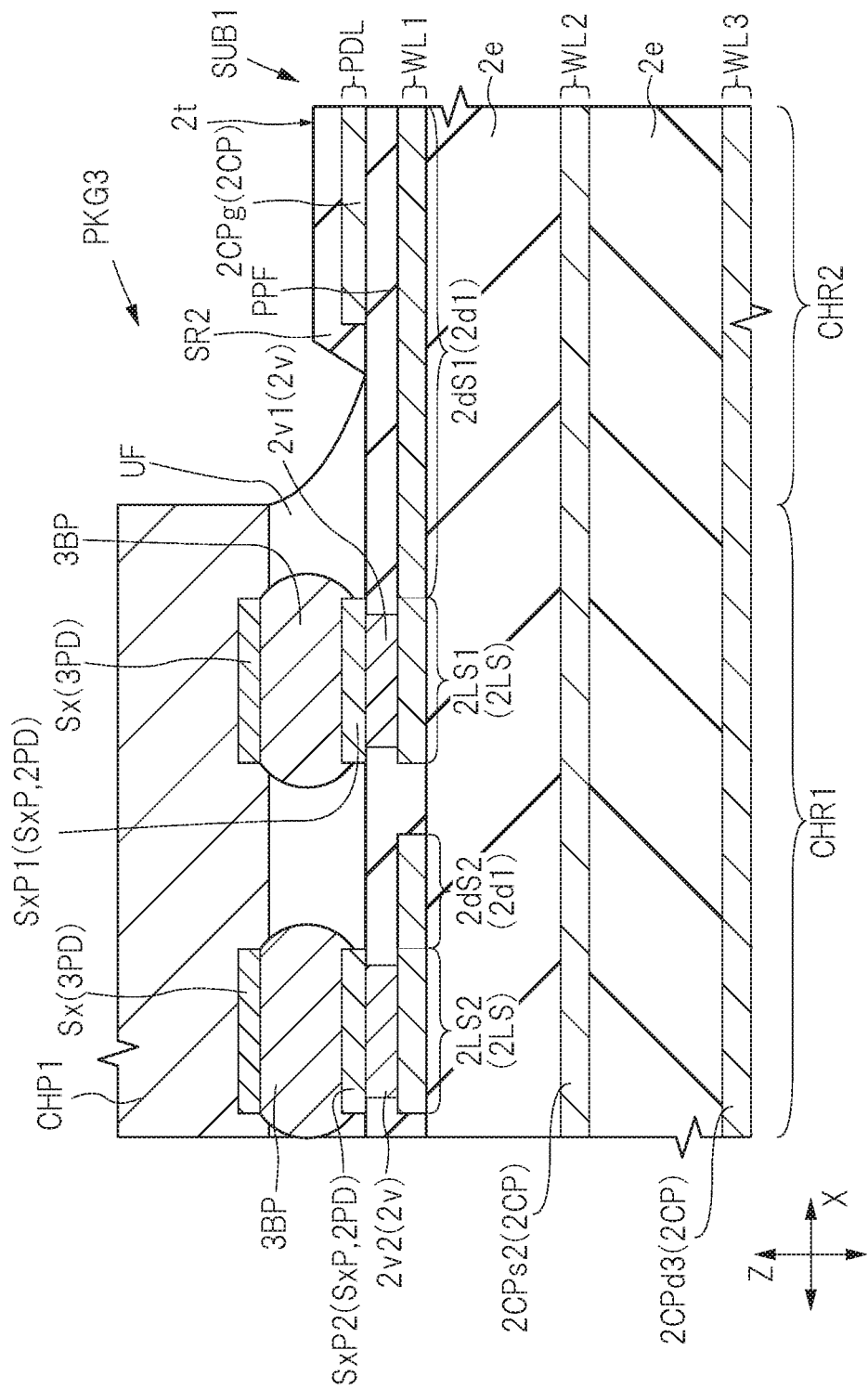
FIG. 26 is an enlarged cross-sectional view of the semiconductor device in FIG. 25, illustrating a portion corresponding to FIG. 10 in an enlarged manner.

For example, the semiconductor device PKG1 illustrated in FIG. 10 has a structure in which the insulating film PPF which is a base layer of the pad forming layer PDL is exposed in the region CHR2. As a modification with respect to the semiconductor device PKG1, the conductor patterns 2CPg may be formed on the insulating film PPF in the region CHR2 like a semiconductor device PKG3 illustrated in FIG. 25 and FIG. 26. FIG. 25 is a cross-sectional view illustrating a semiconductor device according to a modification with respect to the semiconductor device in FIG. 6. FIG. 26 is an enlarged cross-sectional view of the semiconductor device in FIG. 25, illustrating a portion corresponding to FIG. 10 in an enlarged manner.

The semiconductor device PKG3 illustrated in FIG. 25 and FIG. 26 is the same as the semiconductor device PKG1 (see FIG. 6) except for the differences described below. Therefore, overlapped description will be omitted. Description will be made with reference to FIG. 18 shown as an explanatory drawing of the semiconductor device PKG1 and FIG. 24 shown as an explanatory drawing of the semiconductor device PKG2.

The semiconductor device PKG3 illustrated in FIG. 25 and FIG. 26 is different from the semiconductor device PKG1 illustrated in FIG. 6 and FIG. 10 in being provided with the conductor pattern 2CPg formed in the pad forming layer PDL of the wiring substrate SUB1. The pad forming layer PDL of the wiring substrate SUB1 of the semiconductor device PKG3 is provided with the conductor pattern 2CPg arranged in the region CHR2. The conductor pattern 2CPg is a ground plane configured to receive a supply of the reference potential, and is electrically connected to the conductor pattern 2CPs1 illustrated in FIG. 18 through the vias 2vs. In addition, the conductor pattern 2CPg is formed so as to cover a major part of the region CHR2, and the area of the conductor pattern 2CPg is larger than the area of the portion of the conductor pattern 2CPs1 in the region CHR1 illustrated in FIG. 12. In the region CHR2, each of the plurality of wirings 2d1 overlaps with the conductor pattern 2CPg of the pad forming layer PDL.

As illustrated in FIG. 25 and FIG. 26, the semiconductor device PKG3 has a structure in which the wirings 2d1 which are signal wirings are interposed between the conductor pattern 2CPg which is a ground plane of the pad forming layer PDL and the conductor pattern 2CPs2 which is a ground plane of the wiring layer WL2 in the region CHR2. Also, in the region CHR2, the conductor pattern 2CPs1 is arranged between the wirings 2d1 adjacent to each other as described with reference to FIG. 18. Therefore, the strip line structure can be applied to the wirings 2d1 which are signal wirings. Electromagnetic waves generated when a signal current flows in the wiring 2dS1 illustrated in FIG. 26 are shielded by the conductor pattern 2CPg, the conductor pattern 2CPs2, and the conductor pattern 2CPs1 illustrated in FIG. 18. Therefore, noise can be reduced more than the case of the microstrip line structure described with reference to FIG. 19.

In plan view, part of the conductor pattern 2CPg overlaps with the conductor pattern 2CPs1 illustrated in FIG. 18. Therefore, the reference potential can be supplied to the conductor pattern 2CPg by electrically connecting the conductor pattern 2CPg and the conductor pattern 2CPs1 through the vias 2vs as illustrated in FIG. 25.

The conductor pattern 2CPg provided in the semiconductor device PKG3 is covered with the insulating film SR2 different from the insulating film PPF that covers the wiring layer WL1. For example, the solder resist film may be used as the insulating film SR2. However, since the insulating film SR2 is a protective insulating film for protecting the conductor pattern 2CPg from damage or oxidation, the insulating film SR2 is preferably made of a material having high impact alleviating properties and low moisture absorbance.

Note that although the conductor pattern 2CPg is preferably covered with the insulating film SR2 in order to protect the conductor pattern 2CPg from oxidation or the like, the insulating film SR2 is not essential in terms of application of the strip line structure described above. Therefore, a modification in which the insulating film SR2 is not formed and thus the conductor pattern 2CPg is exposed is also applicable.

In addition, when the insulating film SR2 is formed also in the region CHR1 as the protective film for the conductor pattern 2CPg, a structure in which parts of the plurality of pads 2PD are covered with the insulating film SR2 is possible like the semiconductor device PKG2 described with reference to FIG. 24. However, as described above, the plane area of the pads 2PD is preferably smaller in terms of reduction of the parasitic capacitance of the pads 2PD. Further, in order to reduce the plane area of the pads 2PD, the pads 2PD are preferably not covered with the insulating film SR2. Therefore, as illustrated in FIG. 25 and FIG. 26, in the case of the semiconductor device PKG3, the insulating film SR2 is not formed in the region CHR1, and each of the plurality of pads 2PD is exposed from the insulating film SR2.

<Modification 2>

Figure 27:
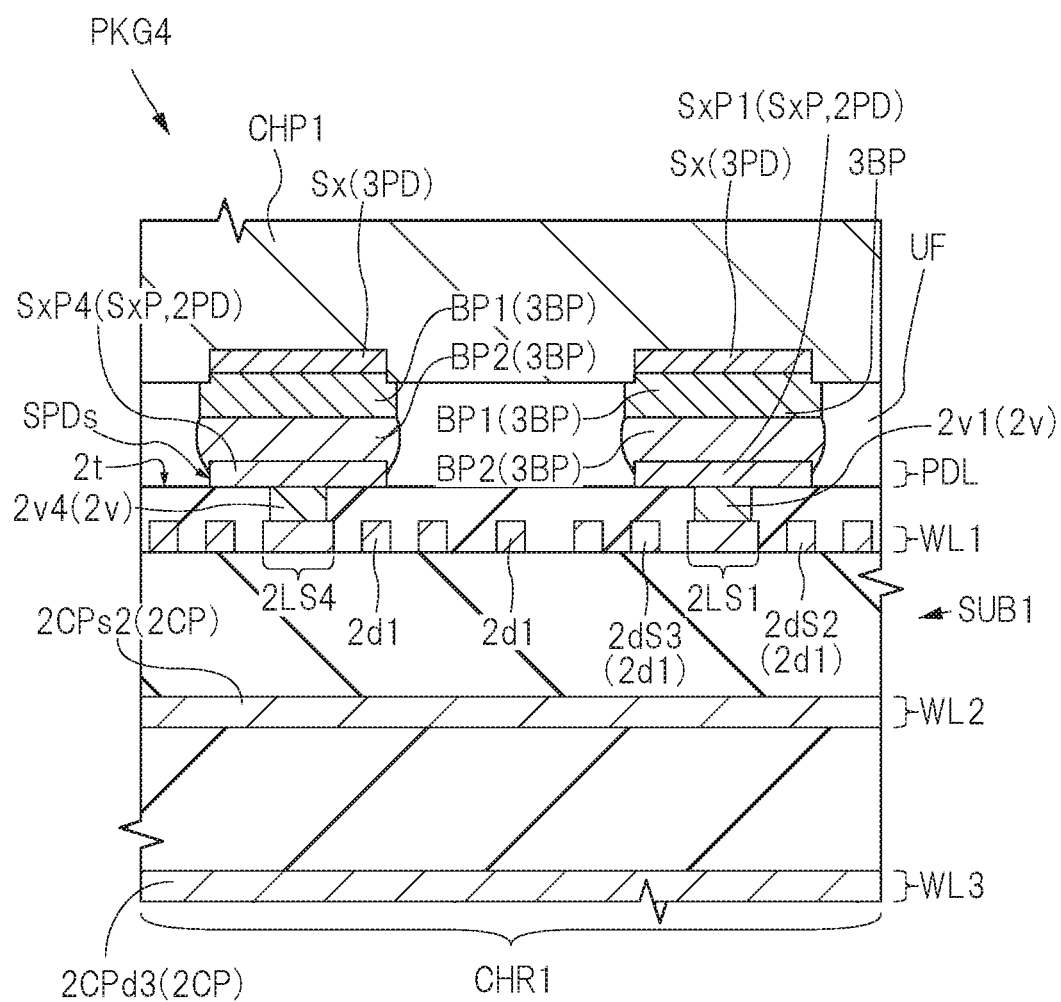
FIG. 27 is an enlarged cross-sectional view illustrating a semiconductor device according to another modification with respect to the semiconductor device in FIG. 11.

In the example illustrated in FIG. 10 and FIG. 11, the case where the conductive members configured to electrically connect the electrodes 3PD of the semiconductor chip CHP1 and the pads 2PD of the wiring substrate SUB1 are the projecting electrodes 3BP which are solder bumps has been described. However, various modifications are conceivable for the conductive members configured to electrically connect the electrodes 3PD and the pads 2PD of the wiring substrate SUB1. FIG. 27 is an enlarged cross-sectional view illustrating a semiconductor device according to another modification with respect to the semiconductor device in FIG. 11. For example, in a case of a semiconductor device PKG4 illustrated in FIG. 27, the projecting electrodes (conductive members) 3BP configured to electrically connect the electrodes 3PD and the pads 2PD of the wiring substrate SUB1 each include a pillar bump BP1 which is a metal member extending in a pillar shape and a solder material BP2. The pillar bump (Cu pillar) BP1 is made of a metal containing copper (Cu) as a main component, and has a distal end surface opposing the pad 2PD. Also, the solder material PB2 is joined to distal end surface of the pillar bump BP1. In the case of the projecting electrodes 3BP provided in the semiconductor device PKG1, the amount of solder material to be used is smaller than the case of the projecting electrodes 3BP illustrated in FIG. 11.

Although illustration is omitted, the pillar bumps BP1 made of a metal containing copper as a main component and the pads 2PD made of a metal containing copper as a main component may be joined directly to each other in some cases. In this case, the solder is not interposed between the pillar bumps BP1 and the pads 2PD, and thus joint portions are less likely to be broken. Also, in the case of the joint method in which the metals containing copper as a main component are directly joined, formation of metal compound under a high temperature storage environment is suppressed compared with the joint method in which solder is interposed, so that breakage of the joint portion and breakage by electromigration are suppressed. Further, in the case of the joint method in which the metals containing copper as a main component are directly joined, resistance at the joint portions can be reduced compared with the joint method in which solder is interposed.

When the joint method in which the metals containing copper as a main component are directly joined to each other is applied, for example, after the pads 2PD are formed by the steps described with reference to FIGS. 20 to 23, a metal-joining step for joining the surfaces of the pads 2PD by applying a paste material containing a number of nanometal particles onto the pads 2PD and performing a reflow joint or sintering the joint portions is added.

<Modification 3>

Figure 28:
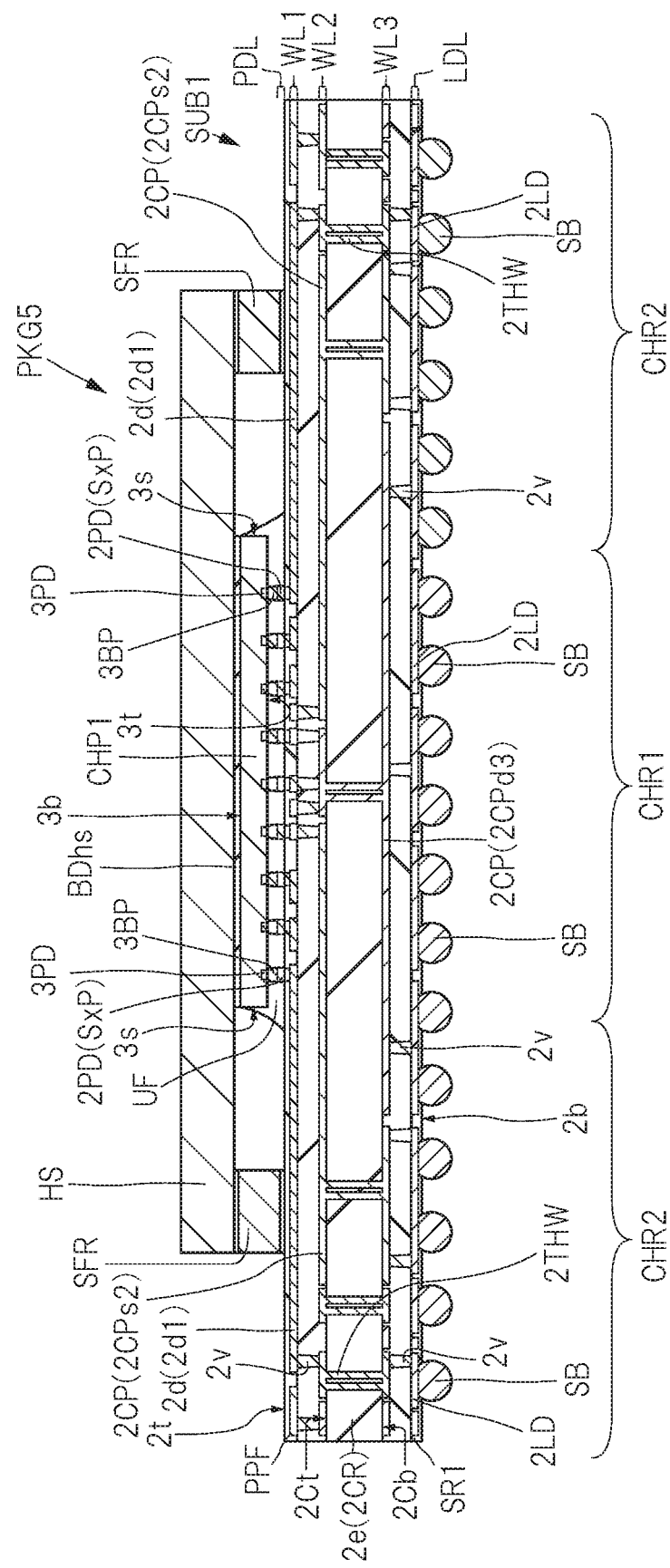
FIG. 28 is a cross-sectional view illustrating a semiconductor device according to another modification with respect to the semiconductor device in FIG. 6.
Figure 29:
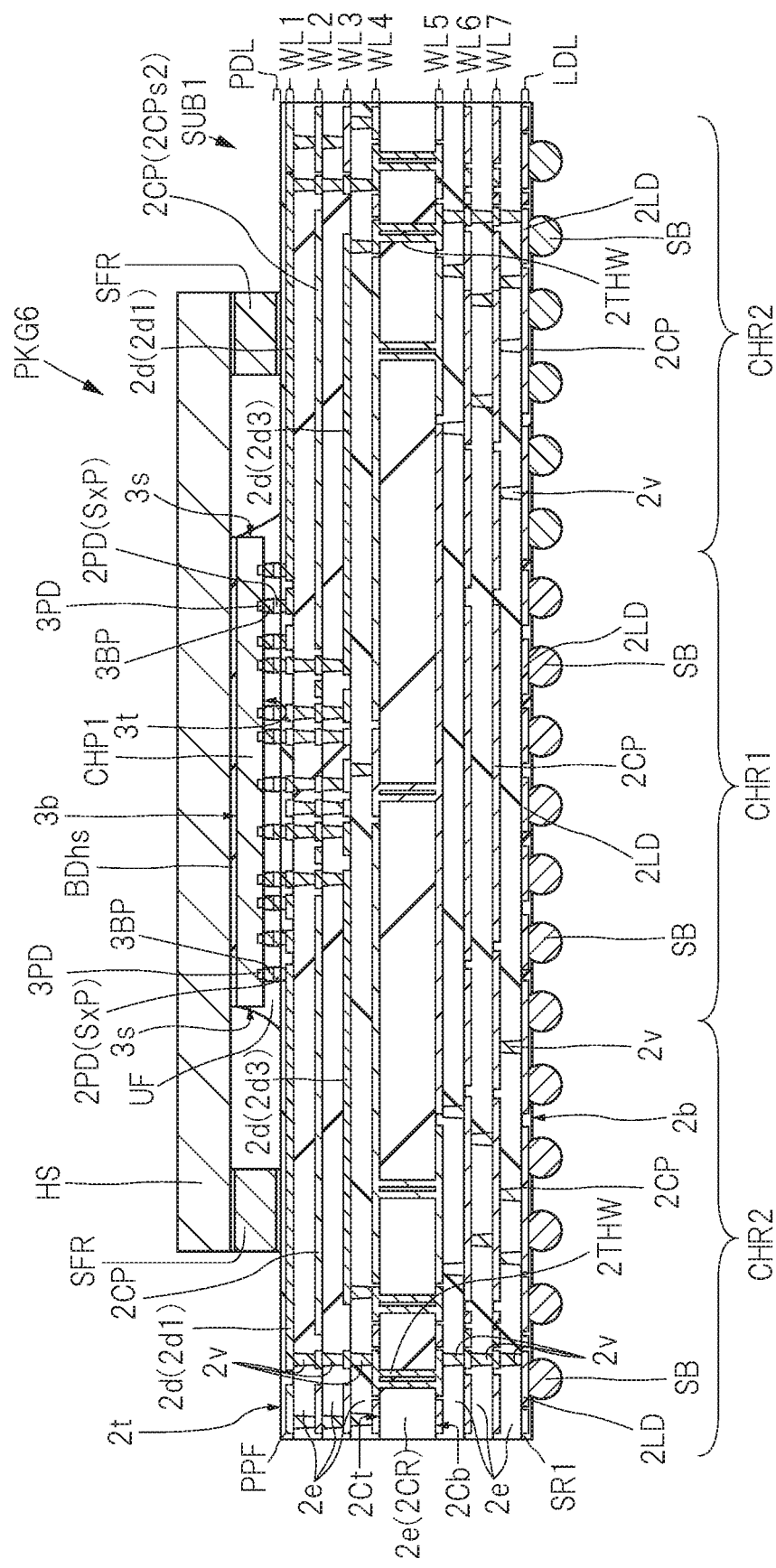
FIG. 29 is a cross-sectional view illustrating a semiconductor device according to another modification with respect to the semiconductor device in FIG. 6.

An embodiment applied to a wiring substrate provided with seven wiring layers in addition to the pad forming layer PDL and the land forming layer LDL is illustrated in the example in FIG. 6. However, the number of wiring layers provided in the wiring substrate may include various modifications. FIG. 28 and FIG. 29 are cross-sectional views each illustrating a semiconductor device according to another modification with respect to the semiconductor device in FIG. 6. In the case of a semiconductor device PKG5 illustrated in FIG. 28, a wiring layer having a three-layer structure including the wiring layers WL1, WL2, and WL3 is provided between the pad forming layer PDL and the land forming layer LDL. In the case of the semiconductor device PKG5, the wiring layer WL2 is provided on the upper surface 2Ct of the insulating layer 2CR which is a core insulating layer, and the wiring layer WL3 is provided on the lower surface 2Cb of the insulating layer 2CR. The large area conductor pattern 2CPs2 which is a ground plane is provided in the wiring layer WL2. Also, the large area conductor pattern 2CPd3 which is a power supply plane is formed in the wiring layer WL3.

In the case of the semiconductor device PKG5, the signal wirings (wirings 2d1) for leading a number of the signal transmission paths connected to the signal pads SxP from the region CHR1 to the region CHR2 are arranged only in the wiring layer WL1. Also, the semiconductor device PKG5 includes the wiring layer WL2 in which the ground plane is mainly arranged and the wiring layer WL3 in which the power supply plane is mainly arranged. In this case, the number of the wiring layers provided in the wiring substrate SUB1 can be reduced while improving the density of arrangement of the signal pads SxP that constitute the signal transmission paths.

Further, the case in which the signal pads SxP are arranged in six rows is illustrated in the example in FIG. 9. When the number of the signal transmission paths further increases, the number of rows of the signal pads SxP may further increases correspondingly. However, when the number of the signal wirings (wirings 2d1 illustrated in FIG. 12) arranged between the adjacent signal pads SxP increases, it becomes difficult to lead the signal wirings from the region CHR1 to the region CHR2 only by the wiring layer WL1 in some cases.

As a countermeasure for this case, for example, the signal transmission paths may be led out from the region CHR1 to the region CHR2 in the plurality of wiring layers like a semiconductor device PKG6 illustrated in FIG. 29. In the case of the semiconductor device PKG6, part of the signal transmission paths (for example, signal transmission paths for six rows) among the signal transmission paths connected to the plurality of signal pads SxP arranged in many rows are led out in the wiring layer WL1. Also, the other signal transmission paths (for example, the signal transmission paths for the other four rows) are led out from the region CHR1 to the region CHR2 through a plurality of the wirings (third-layer wirings) 2d3 in the wiring layer other than the wiring layer WL1 (wiring layer WL3 in the example illustrated in FIG. 29).

Figure 30:
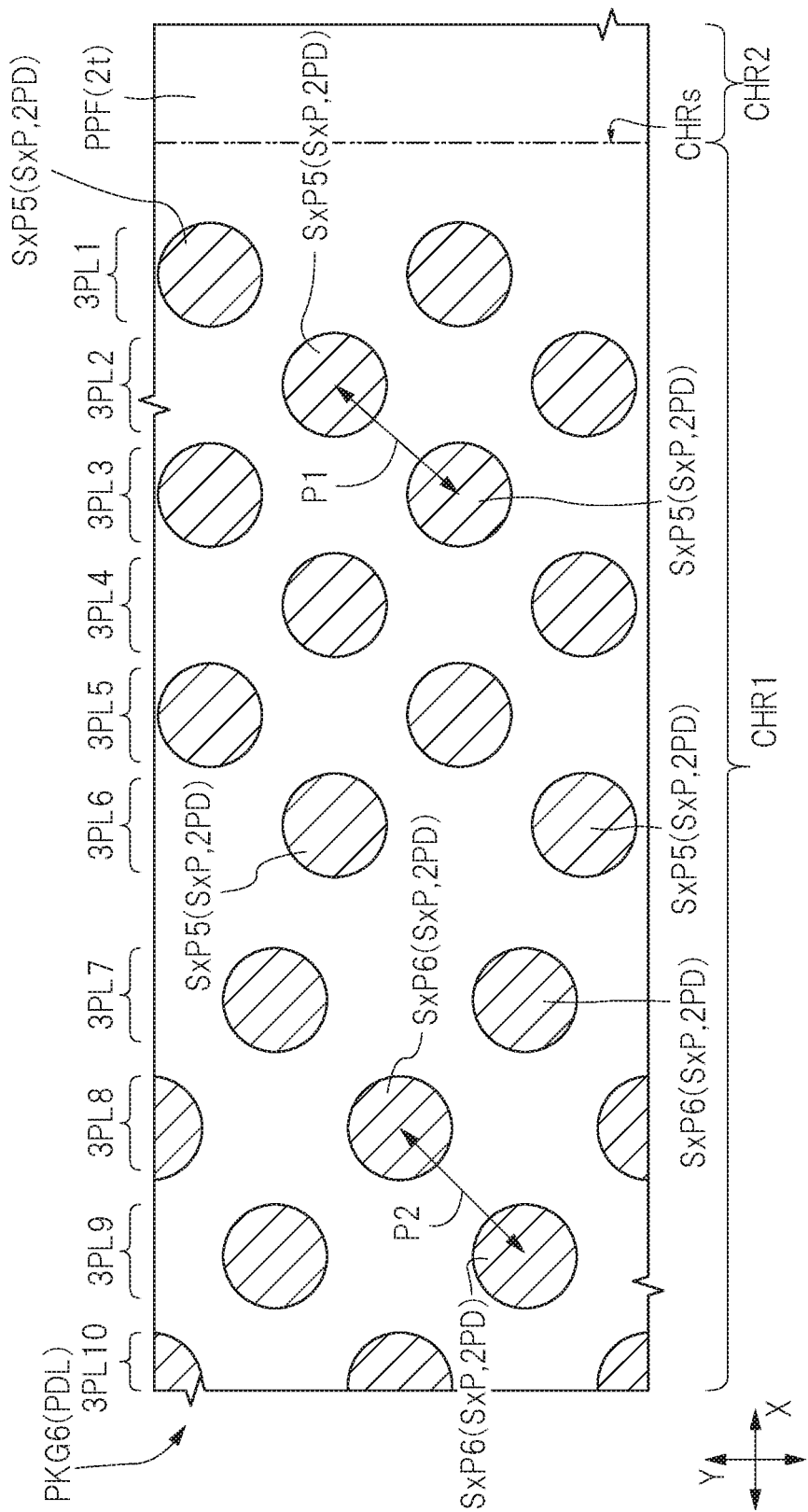
FIG. 30 is an enlarged plan view illustrating a layout example of a plurality of pads in a pad forming layer of a wiring substrate provided in the semiconductor device in FIG. 29.

FIG. 30 is an enlarged plan view illustrating a layout example of a plurality of pads in the pad forming layer of a wiring substrate provided in the semiconductor device in FIG. 29. The plurality of signal pads SxP provided in the semiconductor device PKG6 illustrated in FIG. 30 include a plurality of signal pads SxP5 connected to the wirings 2d1 (see FIG. 29) of the wiring layer WL1 (see FIG. 29) and a plurality of signal pads SxP6 connected to the wirings 2d3 (see FIG. 29) of the wiring layer WL3 (see FIG. 29). Each of the plurality of signal pads SxP5 is arranged at a position closer to a boundary between the region CHR1 and the region CHR2 than each of the plurality of signal pads SxP6. In the example illustrated in FIG. 30, the plurality of signal pads SxP5 are arranged in the rows 3PL1 to 3PL6. The plurality of signal pads SxP6 are arranged in the rows 3PL7 to 3PL10.

The plurality of signal pads SxP are connected respectively to the vias 2v. However, the plurality of signal pads SxP5 and the plurality of signal pads SxP6 are arranged at different pitches. Specifically, a pitch (distance between centers) P2 of the adjacent signal pads SxP6 among the plurality of signal pads SxP6 is wider than a pitch (distance between centers) P1 of the adjacent signal pads SxP5 among the plurality of signal pads SxP5. The signal pads Sx6 are connected to the wiring layer WL3 (see FIG. 29) in the region CHR1. Therefore, it is difficult to narrow the pitches compared with the signal pads SxP5 led out to the chip region CHR2 in the wiring layer WL1 (see FIG. 29). Accordingly, in the case of the semiconductor device PKG6, the pitch of the signal pads SxP5 is narrowed by applying the structure described with reference to FIGS. 9 to 17 to the plurality of signal pads SxP5. On the other hand, the plurality of signal pads SxP6 are arrayed at the pitch P2 wider than that of the plurality of signal pads SxP5. In this case, the number of wiring layers increases compared with the case where all the signal wirings are arranged in the wiring layer WL1. However, by applying the structure described with reference to FIGS. 9 to 17 to part of the plurality of signal transmission paths, the increase in the number of wiring layers can be suppressed as a whole.

<Modification 4>

In the example illustrated in FIG. 9, only the signal pads SxP are arranged in each of the rows 3PL1 to 3PL6, and the pads VsP configured to receive a supply of the reference potential and the pads VdP configured to receive a supply of the power supply potential are not arranged. The pads VsP and the pads VdP may be arranged in each of the rows 3PL1 to 3PL6 illustrated in FIG. 9. In this case, when the pads VsP and the pads VdP are arranged between the signal pads SxP, the vias 2v having the same shape as the vias 2v1 illustrated in FIG. 14 are connected to these pads 2PD. The pads VsP and the pads VdP arranged between the signal pads SxP are electrically connected to via lands (illustration is omitted) having the same shape as the via land 2LS1 illustrated in FIG. 14. In this case, part of the plurality of wirings 2d1 illustrated in FIG. 12 may be used as the supply paths for the reference potential. Alternatively, the vias 2v having the same shape as the vias 2v1 illustrated in FIG. 14 may be connected to the lower layer of the via lands configured to receive a supply of the reference potential or the power supply potential and may be electrically connected to the conductor pattern 2CPs2 and the conductor pattern 2CPd2 illustrated in FIG. 15. When the pads VsP or the pads VdP are arranged in each of the rows 3PL1 to 3PL6 illustrated in FIG. 9, the pads VsP and the pads VdP can be used as the reference paths.

<Modification 5>

In the case of the semiconductor device PKG1 illustrated in FIG. 6, a simplified configuration example has been described for making the description about the connection structure between the plurality of pads 2PD and the wiring layer WL1 easy to understand. However, the above-described technique and the modifications can be applied to semiconductor devices of various configurations. For example, the semiconductor device PKG1 includes one semiconductor chip CHP1 mounted on the wiring substrate SUB1. However, the number of electronic components including the semiconductor chip CHP1 is not limited to one. For example, the above-described technique and the modifications may also be applied to a multi-chip module in which a plurality of semiconductor chips are mounted on the wiring substrate SUB1. Alternatively, the above-described technique and the modifications may be applied to a multi-package module including semiconductor packages (semiconductor components, electronic components) such as a Double-Data-Rate (DDR) memory, a flash memory, and Power Management Integrated Circuits (PMIC) in addition to the semiconductor chips (semiconductor components, electronic components). Further, electronic components such as a capacitor or an inductor may be mounted in addition to the semiconductor chip CHP1. For example, a DC component in an AC signal can be cut by connecting a capacitor to the middle of the signal transmission path of the AC signal in series. The capacitor to be connected to the middle of the signal transmission path for the purpose of cutting the DC component is referred to as "DC cut capacitor", and may be mounted on the wiring substrate SUB1. In addition, in terms of stabilization of the power supply to the semiconductor chip CHP1, a bypass capacitor may be inserted in the power supply path. Such a bypass capacitor may be mounted on the wiring substrate SUB1.

<Modification 6>

In FIG. 2, as an example of the signal transmission, the embodiment in which the signal of the single end is transmitted has been described. However, the signal transmission system is not limited to the single end, and a differential signal may be transmitted. When transmitting the differential signal, each of the plurality of signal transmission paths SGP illustrated in FIG. 2 includes a differential pair. Therefore, two signal wirings are required for transmitting one type of the differential signal. The two signal wirings which constitute the differential pair preferably extend adjacent to each other in parallel and have a small difference in extension distance in order to satisfy conditions such as noise impact and transmission loss.

<Modification 7>

In the description above, for example, the embodiment in which the pad forming layer PDL is further provided on the uppermost wiring layer WL1 of the wiring substrate SUB1 which is a package substrate formed by the build-up method has been described as illustrated in FIG. 6. However, a technique of providing the pad forming layer PDL for accommodating densification of the signal transmission paths can be applied to various modifications in addition to the example illustrated in FIG. 6. For example, the technique can be applied to a mother board which is a supporting substrate on which a plurality of electronic components including the semiconductor packages (semiconductor components, electronic components) are mounted and which is configured to support the electronic components, or to an interposer substrate configured to electrically connect a plurality of modules.

<Modification 8>

Further, various modifications that have been described above may be applied in combination.

In addition, part of the contents described in the above-described embodiments will be described below.

[Appendix 1]

A method of manufacturing a semiconductor device including:

(a) a step of preparing a wiring substrate including a first main surface, a second main surface on an opposite side from the first main surface, a plurality of pads arrayed on the first main surface, and a plurality of wiring layers provided between the first main surface and the second main surface; and (b) after the step (a), a step of mounting a semiconductor component having a first front surface, a first back surface on an opposite side from the first front surface, and a plurality of electrodes arrayed on the first front surface, on the wiring substrate such that the first front surface opposes the first main surface of the wiring substrate, the step (a) including:

(a1) a step of forming a plurality of wiring layers including a first wiring layer by a build-up method;

(a2) after the step (a1), a step of forming a first insulating film made of a photosensitive resin on the first wiring layer;

(a3) after the step (a2), a step of irradiating the first insulating film with light to form a plurality of through holes in the first insulating film;

(a4) after the step (a3), a step of forming a seed metal film on the first insulating film and in each of the plurality of through holes; and (a5) after the step (a4), a step of forming a plating mask provided with a plurality of openings on the seed metal film, and forming a plurality of vias in the plurality of through holes and the plurality of pads in a pad forming layer on the plurality of vias, wherein in the step (a1), a first via land configured to receive transmission of a first signal, a first wiring connected to the first via land and extending in a first direction, a second via land configured to receive transmission of a second signal different from the first signal, and a second wiring connected to the second via land and extending adjacent to the first wiring in the first direction are formed in the first wiring layer, in the step (a4), a first via included in the plurality of vias is formed on the first via land and a second via included in the plurality of vias is formed on the second via land, respectively, in the (a5) step, a first pad is formed on the first via and a second pad is formed on the second via, respectively, in a second direction intersecting with the first direction, a width of the first via land is larger than a width of the first wiring, and in plan view, the second wiring is adjacent to the first via land and overlaps with the first pad.

In the foregoing, the invention made by the inventors of the present invention has been specifically described based on the embodiments. However, it is needless to say that the present invention is not limited to the foregoing embodiments and various modifications can be made within the scope of the present invention.

What is claimed is:

1. A semiconductor device comprising:
a semiconductor chip including a first front surface, a first back surface on an opposite side from the first front surface, and a plurality of electrodes arrayed on the first front surface; and
a wiring substrate including a first main surface on which the semiconductor chip is mounted, a second main surface on an opposite side from the first main surface, a plurality of pads arrayed on the first main surface, and a plurality of wiring layers provided between the first main surface and the second main surface,
wherein the plurality of electrodes of the semiconductor chip and the plurality of pads of the wiring substrate face each other and are electrically connected through conductive members,
wherein the wiring substrate includes a pad forming layer in which the plurality of pads is formed and a first wiring layer which is located at a position closer to the pad forming layer than the other wiring layers,
wherein the plurality of pads includes a first pad and a second pad,
wherein the first wiring layer includes a first via land, a second via land, a first wiring and a second wiring,
wherein the first via land is arranged at a position overlapping with the first pad in plan view and electrically connected to the first pad through a first via,
wherein the second via land is arranged at a position overlapping with the second pad in plan view and electrically connected to the second pad through a second via,
wherein the first wiring is connected to the first via land and extends in a first direction and the second wiring is connected to the second via land and extends adjacent to the first wiring in the first direction,
wherein, in a second direction intersecting with the first direction, a width of the first via land is larger than a width of the first wiring,
wherein the second wiring is adjacent to the first via land and overlaps with the first pad in plan view, wherein the first main surface of the wiring substrate and each of the plurality of wiring layers include a first region overlapping with the semiconductor chip and a second region located around the first region without overlapping with the semiconductor chip, wherein the first and second wirings extend across the first region and the second region, wherein the first pad is configured to receive transmission of a first signal and the second pad is configured to receive transmission of a second signal different from the first signal, wherein the first wiring layer is located at a position closest to the pad forming layer among the plurality of wiring layers, wherein the first via land has a first width in the first direction and a second width in the second direction in plan view, wherein the second width of the first via land is smaller than the first width, wherein, in a region where the first pad and the second wiring overlap, a width of the second wiring in the second direction is smaller than the second width of the first via land, wherein the first via has a third width in the first direction and a fourth width in the second direction in plan view, wherein the fourth width of the first via is smaller than the third width, wherein the second width of the first via land is larger than the fourth width of the first via, and wherein the first width of the first via land is larger than the third width of the first via.

2. The semiconductor device according to claim 1, wherein the plurality of pads includes a plurality of first potential pads configured to receive a supply of a first potential, wherein a plurality of conductor patterns includes first conductor patterns electrically connected respectively to the plurality of first potential pads through a plurality of first potential vias, wherein each of the plurality of first potential vias has a fifth width in the second direction in plan view, and wherein the fifth width of each of the plurality of first potential vias is larger than the fourth width of the first via.

3. The semiconductor device according to claim 2, wherein the first wiring is arranged on one side of the first via land and the first conductor pattern is arranged on the other side of the first via land in the first direction, and wherein the second via land is arranged between the first via land and the first conductor pattern in the first direction.

4. The semiconductor device according to claim 2, wherein the plurality of first potential pads is arrayed along a third direction intersecting the first direction.

5. The semiconductor device according to claim 4, wherein the wiring substrate includes a second wiring layer located at a position closest to the first wiring layer among the plurality of wiring layers, wherein the second wiring layer includes a second conductor pattern electrically connected to the first conductor pattern and having a larger area than a portion of the first conductor pattern in the first region, and wherein each of a plurality of first-layer wirings overlaps with the second conductor pattern in the second wiring layer in the second region.

6. The semiconductor device according to claim 5, wherein the first conductor pattern is configured to receive a supply of the first potential and is located both in the first region and in the second region in the first wiring layer, and wherein the first conductor pattern is separated from each of the plurality of first-layer wirings and is arranged between the plurality of first-layer wirings in the second region.

7. The semiconductor device according to claim 4, wherein the pad forming layer includes a third conductor pattern arranged in the second region, configured to receive a supply of the first potential, and having an area larger than a portion of the first conductor pattern in the first region, and wherein each of a plurality of first-layer wirings overlaps with the third conductor pattern in the pad forming layer in the second region.

8. The semiconductor device according to claim 7, wherein the plurality of first-layer wirings and the plurality of conductor patterns are covered with a first insulating film, wherein the third conductor pattern in the second region is covered with a second insulating film different from the first insulating film, and wherein the second insulating film is not formed in the first region and the plurality of pads are exposed from the second insulating film.

9. The semiconductor device according to claim 1, wherein the wiring substrate includes a second wiring layer located at a position closest to the first wiring layer among the plurality of wiring layers, wherein the plurality of pads arranged in the pad forming layer include a plurality of signal pads configured to receive transmission of a signal, wherein a plurality of conductor patterns formed in the first wiring layer are arranged at positions overlapping with the plurality of signal pads and include a plurality of signal via lands electrically connected to the plurality of signal pads, wherein the plurality of signal via lands are connected respectively to a plurality of signal vias configured to electrically connect the first wiring layer and the second wiring layer through a plurality of first-layer wirings, and the plurality of signal via lands do not overlap with the plurality of signal vias.

10. The semiconductor device according to claim 1, wherein a plurality of first-layer wirings and a plurality of conductor patterns are covered with a first insulating film made of a photosensitive resin, wherein a plurality of through holes formed at positions overlapping with the plurality of conductor patterns are formed in the first insulating film, and wherein a plurality of vias are embedded in the plurality of through holes.

11. The semiconductor device according to claim 10, wherein the wiring substrate includes a second wiring layer located at a position closest to the first wiring layer among the plurality of wiring layers, wherein the wiring substrate includes a third insulating film between the first wiring layer and the second wiring layer, and wherein a thickness of the first insulating film is smaller than a thickness of the third insulating film.

12. The semiconductor device according to claim 1,
wherein the conductive members configured to electrically connect the plurality of electrodes of the semiconductor chip and the plurality of pads of the wiring substrate are sealed with an insulative resin, and
wherein each of side surfaces of the plurality of pads comes into contact with the insulative resin or each of the conductive members.

13. The semiconductor device according to claim 1,
wherein the plurality of pads includes a third pad configured to receive a third signal different from the first signal and the second signal,
wherein a plurality of conductor patterns formed in the first wiring layer include a third via land arranged at a position overlapping with the third pad in plan view and electrically connected to the third pad through a third via,
wherein a plurality of first-layer wirings include a third wiring connected to the third via land and extending adjacent to the first wiring in the first direction, and
wherein, in plan view, the first via land is located between the second wiring and the third wiring, and the third wiring overlaps with the first pad.

14. The semiconductor device according to claim 1,
wherein the plurality of pads includes a fourth pad arrayed adjacent to the first pad along a second direction intersecting the first direction and configured to receive transmission of a fourth signal different from the first signal and the second signal,
wherein a plurality of conductor patterns formed in the first wiring layer include a fourth via land arranged at a position overlapping with the fourth pad in plan view and electrically connected to the fourth pad through a fourth via, and
wherein five or more of a plurality of first-layer wirings are arranged between the first via land and the fourth via land in plan view.

15. A semiconductor device comprising:
a semiconductor chip including a first front surface, a first back surface on an opposite side from the first front surface, and a plurality of electrodes arrayed on the first front surface; and
a wiring substrate including a first main surface on which the semiconductor chip is mounted, a second main surface on an opposite side from the first main surface, a plurality of pads arrayed on the first main surface, and a plurality of wiring layers provided between the first main surface and the second main surface,
wherein the plurality of electrodes of the semiconductor chip and the plurality of pads of the wiring substrate face each other and are electrically connected through conductive members,
wherein the wiring substrate includes a pad forming layer in which the plurality of pads is formed and a first wiring layer which is located at a position closer to the pad forming layer than the other wiring layers,
wherein the plurality of pads includes a first pad and a second pad,
wherein the first wiring layer includes a first via land, a second via land, a first wiring and a second wiring,
wherein the first via land is arranged at a position overlapping with the first pad in plan view and electrically connected to the first pad through a first via,
wherein the second via land is arranged at a position overlapping with the second pad in plan view and electrically connected to the second pad through a second via,
wherein the first wiring is connected to the first via land and extends in a first direction and the second wiring is connected to the second via land and extends adjacent to the first wiring in the first direction,
wherein, in a second direction intersecting with the first direction, a width of the first via land is larger than a width of the first wiring,
wherein the second wiring is adjacent to the first via land and overlaps with the first pad in plan view,
wherein the first main surface of the wiring substrate and each of the plurality of wiring layers include a first region overlapping with the semiconductor chip and a second region located around the first region without overlapping with the semiconductor chip,
wherein the first and second wirings extend across the first region and the second region,
wherein the first pad is configured to receive transmission of a first signal and the second pad is configured to receive transmission of a second signal different from the first signal,
wherein the first wiring layer is located at a position closest to the pad forming layer among the plurality of wiring layers,
wherein the first via land has a first width in the first direction and a second width in the second direction in plan view,
wherein the second width of the first via land is smaller than the first width,
wherein, in a region where the first pad and the second wiring overlap, a width of the second wiring in the second direction is smaller than the second width of the first via land,
wherein the wiring substrate includes a second wiring layer located at a position closest to the first wiring layer among the plurality of wiring layers,
wherein, in the first wiring layer, one end of the first wiring is connected to the first via land, and the other end of the first wiring is connected to a fourth conductor pattern,
wherein the fourth conductor pattern is connected to a first signal via configured to electrically connect the first wiring layer and the second wiring layer, and
wherein a width of the fourth conductor pattern in the second direction is larger than the second width of the first via land.

* * * * *